US007805293B2

(12) United States Patent
Takada et al.

(10) Patent No.: US 7,805,293 B2
(45) Date of Patent: Sep. 28, 2010

(54) BAND CORRECTING APPARATUS

(75) Inventors: Masashi Takada, Yokohama (JP); Yoshinari Murakami, Saitama (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 874 days.

(21) Appl. No.: 10/545,670

(22) PCT Filed: Feb. 26, 2004

(86) PCT No.: PCT/JP2004/002302

§ 371 (c)(1),
(2), (4) Date: Aug. 15, 2005

(87) PCT Pub. No.: WO2004/077408

PCT Pub. Date: Sep. 10, 2004

(65) Prior Publication Data

US 2006/0142999 A1 Jun. 29, 2006

(30) Foreign Application Priority Data

Feb. 27, 2003 (JP) ............................ 2003-050832

(51) Int. Cl.
*G10L 19/02* (2006.01)
*G10L 19/14* (2006.01)
*H03G 3/00* (2006.01)

(52) U.S. Cl. ....................... 704/205; 704/203; 704/225; 330/278

(58) Field of Classification Search .............. 704/200.1, 704/500, 501, 502, 503, 504, 205–210, 203, 704/225; 330/278
See application file for complete search history.

(56) References Cited

U.S. PATENT DOCUMENTS 5,109,417 A * 4/1992 Fielder et al. ............... 704/205
5,142,656 A * 8/1992 Fielder et al. ............... 704/229
5,222,189 A * 6/1993 Fielder ....................... 704/229
5,301,205 A * 4/1994 Tsutsui et al. ............... 375/340
5,479,562 A * 12/1995 Fielder et al. ............... 704/229

(Continued)

FOREIGN PATENT DOCUMENTS

JP H03-254223 A 11/1991

(Continued)

OTHER PUBLICATIONS

P. Ekstrand. "Bandwitdh Extension of Audio Signals by Spectral Band Replication," in Proc. 1st IEEE Benelux Workshop on Model based Processing and Coding of Audio (MPCA-2002), Leuven, Belgium, Nov. 2002, pp. 73-79.*

(Continued)

*Primary Examiner*—David R Hudspeth
*Assistant Examiner*—Edgar Guerra-Erazo
(74) *Attorney, Agent, or Firm*—Rabin & Berdo, P.C.

(57) ABSTRACT

A voice band correcting apparatus in which the signal level of limit bands is amplified by a correction filter, the signal level of a correction signal supplied is compared by a level detector to a preset level, and the result of decision is sent as level information to a coefficient controller, where the signal level is adjusted in a controlled manner. The high-quality broadband signal may be obtained on correction without degrading the quality of a communication signal ascribable to excess amplification.

14 Claims, 14 Drawing Sheets

U.S. PATENT DOCUMENTS

| | | | | |
|---|---|---|---|---|
| 5,915,235 | A | 6/1999 | Miller et al. | |
| 6,308,150 | B1 * | 10/2001 | Neo et al. | 704/200.1 |
| 6,889,182 | B2 * | 5/2005 | Gustafsson | 704/205 |
| 7,024,260 | B2 | 4/2006 | Kuwaoka | |
| 7,246,065 | B2 * | 7/2007 | Tanaka et al. | 704/500 |
| 7,328,162 | B2 * | 2/2008 | Liljeryd et al. | 704/503 |
| 7,400,651 | B2 | 7/2008 | Sato | |
| 7,529,660 | B2 * | 5/2009 | Bessette et al. | 704/205 |
| 7,539,613 | B2 * | 5/2009 | Takada | 704/205 |
| 2002/0007280 | A1 * | 1/2002 | McCree | 704/500 |
| 2002/0016698 | A1 | 2/2002 | Tokuda | |
| 2003/0200083 | A1 * | 10/2003 | Serizawa et al. | 704/219 |

FOREIGN PATENT DOCUMENTS

| | | | |
|---|---|---|---|
| JP | 2002-82685 | | 2/2000 |
| JP | 2000-132192 | A | 5/2000 |
| JP | 2002-189498 | A | 7/2002 |
| WO | WO-03/003345 | A1 | 1/2003 |

OTHER PUBLICATIONS

D. Esteban and C. Galand, "Application of QMF to split band voice coding schemes," in Proc. ICASSP-77, p. 191, May 1977.*

P. Ekstrand. "Bandwitdh Extension of Audio Signals by Spectral Band Replication," in Proc. 1st IEEE Benelux Workshop on Model based Processing and Coding of Audio (MPCA-2002), Leuven, Belgium, Nov. 2002, pp. 73-79.*

D. Esteban and C. Galand, "Application of QMF to split band voice coding schemes," in Proc. ICASSP-77, p. 191, May 1977.*

Serizawa, Masahiro et al., "A Packet Loss Concealment Method Using Pitch Waveform Repetition and Internal State Update on the Decoded Speech for the Sub-band ADPCM Wideband Speech CODEC", Speech Coding, IEEE Workshop Proceedings, (Oct 6-9, 2002), pp. 68-70.*

Nilsson et al., "Avoiding over-estimation in bandwidth extension of telephony speech," 2001 IEEE International Conference on Acoustics, Speech and Signal Processing, vol. 2., May 2001, pp. 869-872.

* cited by examiner

AMPLITUDE MEASURING CKT.
48
34
42
44
46
54
52
12
FILTER
FILTER
FILTER
36
38
40
CORRECTION FILTER
10
14
COEFFICIENT UPDATE CKT.
56
64
72
76
60
68
78
66
62
74
70
COEFFICIENT UPDATE CKT.
COEFFICIENT CONTROLLER
58
88
92
90
80
82
84
86
LOW PASS FILTER
BAND PASS FILTER
HIGH PASS FILTER
BAND SPLITTER
18

BAND CORRECTING APPARATUS

BACKGROUND OF THE INVENTION

1. Field of the Invention

The present invention relates to a band correction apparatus and, more particularly, to a signal correction apparatus for correcting the frequency characteristics of band-limited signals.

2. Description of the Background Art

The band correction apparatus for the VoIP (Voice over Internet Protocol) technique, which has recently come into widespread use, packetizes voice signals into IP (Internet Protocol) packets to integrate voice with data. This integration contributes to lowering the network or communications cost. This contribution has led to the coming into widespread use of the technique.

The traditional public switched telephone network (PSTN) attaches importance to how voice signals are to be transmitted. The voice communication has used the band not higher than 3.4 kHz and hence the network is designed to establish a bandwidth per channel of 3.4 kHz. The digital transmission network is based on a communication unit of 64 Kb/sec with a sampling frequency of 8 kHz.

On the other hand, with recent widespread use of the broadband technique and services, the transmission equipment on the network side is now designed to cope with broadband communications. Moreover, even the subscriber lines are coping with the broadband network by means of asymmetrical digital subscriber lines (ADSL) or optical transmission lines, such that end-to-end broadband voice signal transmission has become possible. Currently, there is a demand for voice communications to a still higher quality.

However, with existing general subscriber telephone sets, which are not IP-dedicated telephone sets adapted for IP network, the bandwidth is limited by e.g. an attenuator to 4 kHz or less for setting telephone transmitter and receiver characteristics. With such existing general subscriber telephone sets, the speech quality reached is no more than substantially the same as that allowed by the public switched telephone network in general, even though the transmission line allows frequency band signals higher than 4 kHz as in the IP network.

In order to solve this problem to achieve a meritorious high speech quality even when the existing telephone set uses a transmission channel, such as IP network, which employs broadband signals in common, such a method is currently researched which consists in correcting the frequency characteristics of telephone transmitting and received signals to expand the speech band.

Meanwhile, with the speech band expanding apparatus and method disclosed by the Japanese Laid-Open Patent Publication No. 2002-82685, if a high frequency range signal, which inherently does not exist, is formulated using a low frequency range signal, a speech sound formulated is heard severely unnatural as compared to an original speech sound. Moreover, only a minor amount of speech signal is left in a frequency range lower than the usual range and in a frequency range higher than the usual range. Thus, a calling party is unable to perceive these voice signal components, so that the speech sound, as heard by the calling party, is only of inferior sound quality. In improving the sound quality, the minor signals left in the respective bands may be amplified, as a simple method. However, this simple band expansion is achieved by re-amplifying the components of the lower and higher ranges to raise these components to an audible level. Consequently, the amplification of the band components in the audio signal directly leads to amplitude amplification, such that the amplitude tends to exceed the limitations on the maximum and minimum values in the digital signal processing.

The conventional sequence of operation in expanding the band will now be described. The signal limited in the bandwidth to the range of 300 Hz to 3.4 kHz is supplied as an input signal to a correction filter. The correction filter, responsible for expanding the frequency band, has such characteristics that the band of 300 Hz to 3.4 kHz is not amplified, with the amplification factor by the filter being then unity, while the frequency bands of 0 Hz to 300 Hz and of 3.4 kHz to 8 kHz are amplified by respective amplification characteristics. By this correction, the correction filter outputs a signal having flat characteristics for the frequency range of 0 KHz to 8 kHz.

However, the impulse response, representing the overall filter characteristics, has an amplification degree of +30 dB. In particular, the amplification degree is +40 dB insofar as solely the high frequency range is concerned. It is now assumed that the μ-low is used. If a signal having a magnitude not less than −27 dBm0 is supplied, the output signal is clipped because its instantaneous value readily reaches the maximum value. If the input signal is an ideally bandwidth-limited one, no severe problem is raised. However, if there is an electrical noise outside the range of 300 Hz to 3.4 kHz, this noise is also amplified by +30 dB to +40 dB. For example, with an assumed level of the substrate noise of −50 dBm0, the amplified substrate noise reaches −20 dBm0 to −10 dBm0.

SUMMARY OF THE INVENTION

It is an object of the present invention to provide a band correcting apparatus whereby a narrow band signal may be corrected to a broadband signal without over-amplification in the course of the digital amplification.

For accomplishing the above object, the present invention provides a band correcting apparatus comprising a corrector receiving an input signal limited in frequency band for correcting the input signal with respect to the signal level of each limit band and outputting the corrected signal, a monitor for monitoring whether or not the signal level of the corrected signal reaches a preset level, and a level adjustor for adjusting the signal level responsive to a level information from said monitor circuit.

In accordance with the band correcting apparatus of the present invention, the signal level of the limit band is amplified by the corrector, the signal level of a correction signal supplied from the monitor is compared to a preset level, and the result of decision is sent as the level information to the level adjustor for adjusting the signal level. The input signal may be corrected to a broadband signal, without degrading the quality of a communication signal, ascribable to excess amplification, thus assuring high-quality transmission.

The present invention also provides a band correcting apparatus comprising a band splitter for splitting the frequency spectrum of an input signal into a plurality of limit bands, a corrector for correcting the signal level of the bands obtained on splitting for outputting correction signals, and an analog converter for converting each of the correction signals into analog signals.

In accordance with the band correcting apparatus of the present invention, the input signal is split into respective bands of signal by the band splitter and the resulting bands of signal are sent to the corrector. The signals of the respective bands, obtained on splitting, are corrected in signal level by the corrector. The resulting signals are corrected by the analog converter and combined. In this manner, the voice band can be expanded, as the spontaneous sound quality is maintained, without limitation by the marginal limit of digital representation, even though the signal is amplified to close to the marginal limit of bit representation by the corrector and combined.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
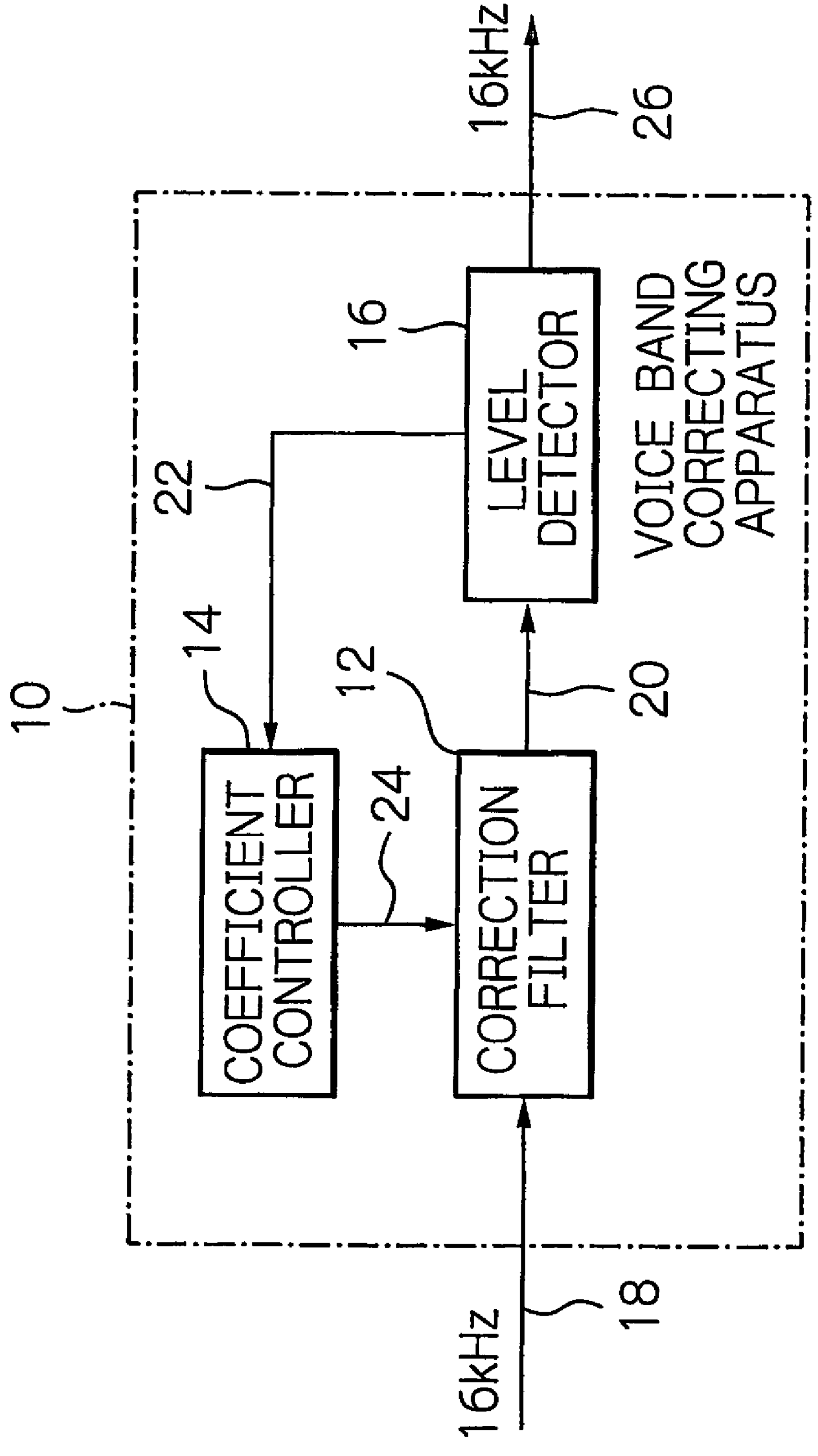
FIG. 1 is a schematic block diagram showing the configuration of a voice band correction apparatus in accordance with the present invention.

Referring to the drawings, certain preferred embodiments of the present invention will be described in detail.

In these embodiments, the band correcting apparatus of the present invention is applied to a voice band correcting apparatus 10. Parts or components not directly relevant to understanding the present invention are not shown nor illustrated in the drawings. The voice band correcting apparatus 10 is adapted to monitor the output of a correction filter and decrease a filter coefficient to control the degree of band expansion, so that limitation on the maximum and minimum values in the range of the digital signal processing is not surpassed.

Referring to FIG. 1, the voice band correcting apparatus 10 includes a correction filter 12, a coefficient controller 14 and a level detector 16 as interconnected as illustrated. The correction filter 12 is an analog or digital filter having the correction function of flattening out the frequency characteristics of a voice signal 18, input from a telephone subscriber set, not shown, over the entire voice frequency band. It is noted that the voice signal 18 may include a signal other than the voice, such as a facsimile or imagewise signal. The correction filter 12 is adapted to correct the voice signal 18 to output a corrected voice signal 20 to the level detector 16.

The coefficient controller 14 has the control function such that, when the output of the correction filter 12 exceeds a limit value, a control signal 24 is sent to the correction filter 12 for changing the coefficient of the correction filter 12 in dependence upon a detection signal 22 supplied from the level detector 16. The coefficient controller 14 also has the function of resetting the coefficient to an original or initial coefficient value when the output of the correction filter 12 has become lower than the limit value. The coefficient controller 14 is also adapted for gradually changing the coefficient in dependence upon the degree of approaching to the limit value. Specifically, the coefficient controller 14 raises the amplification factor of the correction filter to a preset value, while lowering the amplification factor by a decrement of 1 dB in dependence upon the detection signal 22 output from the level detector 16. A preset value is selected such that the input voice signal 18 is amplified by an amplification factor of 30 dB on the whole, for example. It should be noted however that the predetermined amplification factor and the decrement in amplification factor being decreased are not limited to the specific values stated above.

The level detector 16 has the function of receiving and monitoring the corrected voice signal 20 of the correction filter 12 to feed the coefficient controller 14 with a detection signal 22 indicating the state of variation of the corrected output level. The level detector 16 outputs the corrected voice signal 20 as an output signal 26 of the voice band correcting apparatus 10.

Specifically, the level detector 16, monitoring the corrected voice signal 20, verifies whether or not an output value of the correction filter 12 in the form of digital signal assumes the limit value of digital representation by 16 bits, that is, +32768 or −32767. The level detector 16 sends the result of decision as a detection signal 22 to the coefficient controller 14.

It should be noted that the marginal or threshold value used in decision is not limited to the above-given specific values, with the presently described embodiment and the following embodiments, but may, for example, be +16384 or −16384. Any suitable methods may be applicable to determine whether or not these preset values are exceeded, provided that proper decision may be given by such methods used.

Figure 2A:
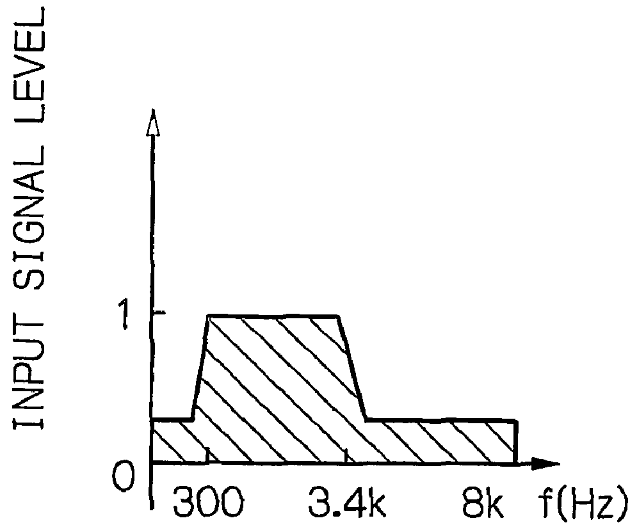
FIGS. 2A, 2B and 2C are graphs plotting the frequency characteristics useful for understanding the band correction by the voice band correction apparatus shown in FIG. 1.
Figure 2B:
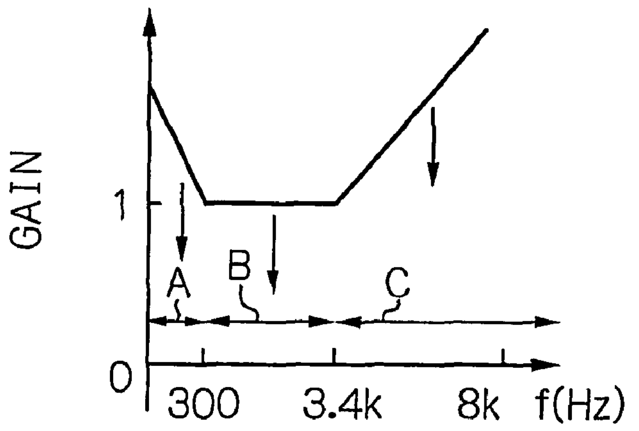
Figure 2C:
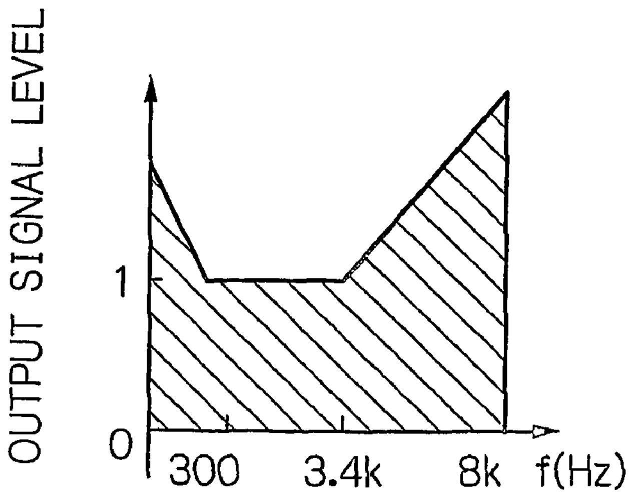

The operation of the voice band correcting apparatus 10 will now be described. The voice signal 18 is limited in the bandwidth to the range of 300 Hz to 3.4 kHz, as shown in FIG. 2A, and are corrupted with electrical noises lying outside this frequency range. The input voice signal 18 is supplied to the correction filter 12 and initially amplified by the correction filter 12 having the frequency characteristics of the gain shown in FIG. 2B. The amplified corrected voice signal 20 is supplied from the correction filter 12 to the level detector 16 as shown in FIG. 2C.

Figure 3A:
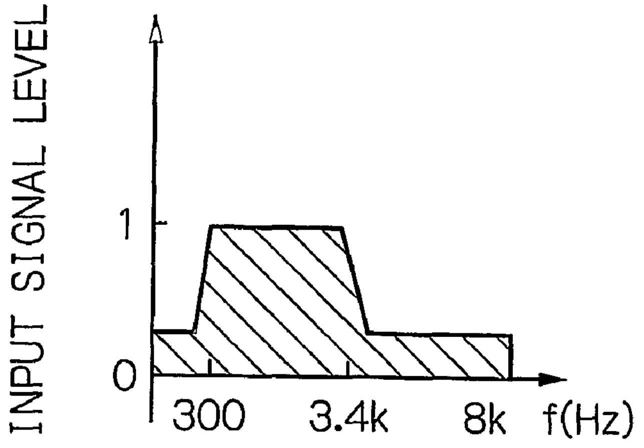
FIGS. 3A, 3B and 3C are graphs plotting the frequency characteristics useful for understanding the band correction by coefficient suppression in the band correction by the voice band correction apparatus shown in FIG. 1.
Figure 3B:
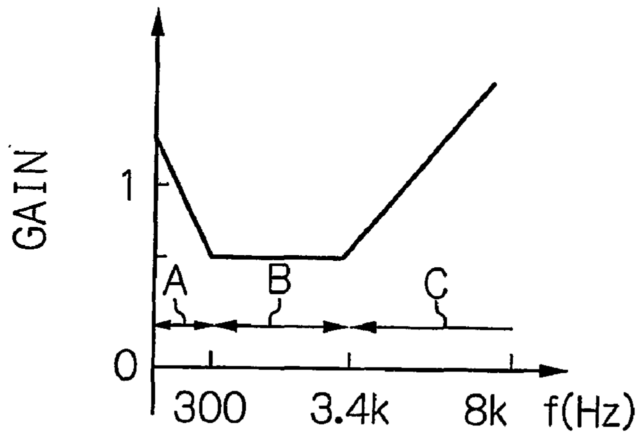

The level detector 16 monitors the level of the amplified, corrected voice signal 20 and, upon detection that the signal level is approaching or has exceeded a maximum value, outputs the detection signal 22 to the coefficient controller 14. The maximum value for say 16 bits is 32768. The coefficient controller 14 receives the detection signal 22 from the level detector 16. The coefficient controller 14 controls over lowering the coefficient values of the correction filter 12 in the respective frequency ranges A, B and C of 0 Hz to 0.3 kHz, 0.3 kHz to 3.4 kHz and not less than 3.4 kHz, in the present embodiment. By this control, the correction filter 12 amplifies the input signal as the filter suppresses the noise level in the input signal, as shown in FIG. 3B.

Figure 3C:
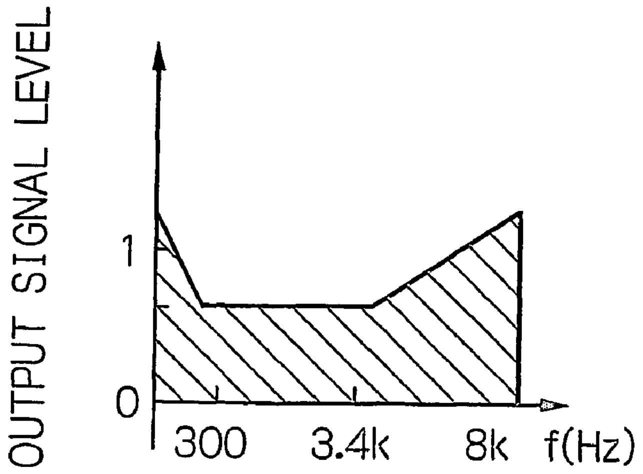

The correction filter 12 may alternatively adapted to predict the state of noise mixing into the input signal 18 to use a correspondingly changed coefficient value. Specifically, the amplification factor of the correction filter 12 may be of preset, initial characteristics shown in FIG. 2B, and the amplification factor for the frequency ranges A, B and C shown in FIG. 3B is lowered by a decrement of 1 dB. It should be noted that the initial frequency gain characteristics and the decrement in lowering the amplification factor are not limited to the above case. In particular, if the amplification factor is lowered for the high frequency range as shown in FIG. 3C, the frequency characteristics of the original sound may be caused to approach to that of the original sound.

Figure 4A:
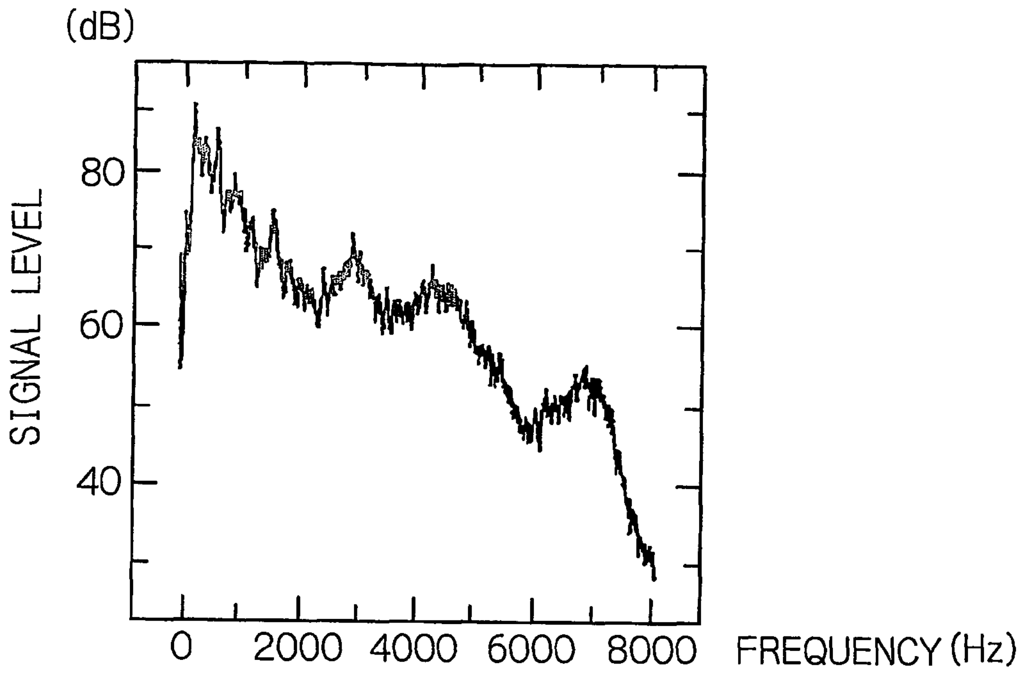
FIGS. 4A and 4B plot the frequency characteristics of an original voice and a voice limited in bandwidth by the telephone set.
Figure 4B:
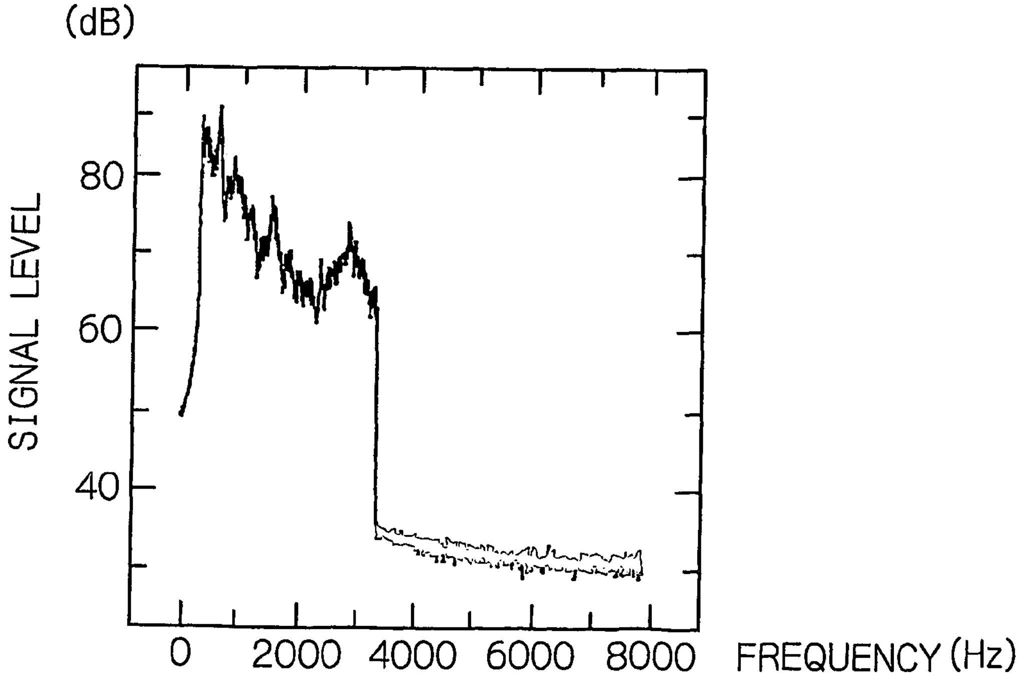
Figure 5:
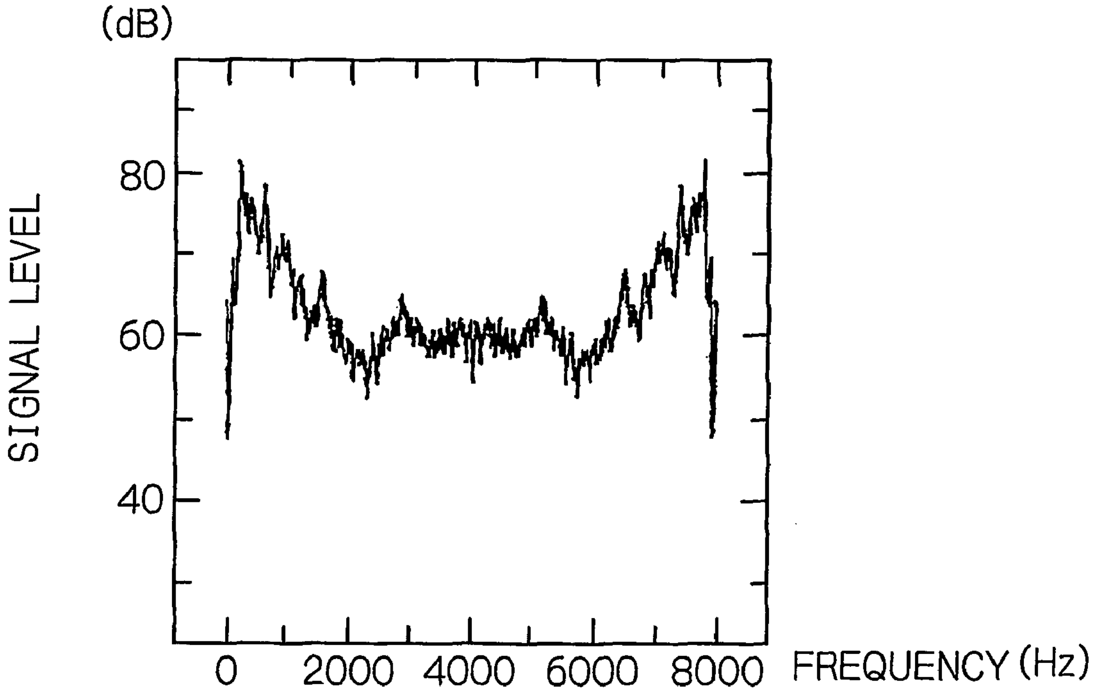
FIG. 5 plots the frequency characteristics useful for understanding the bandwidth correction as obtained with the Comparative Example with respect to the present invention.

As a Comparative Example, the conventional voice band correction apparatus is supplied with the voice signal 18, having the frequency characteristics shown in FIG. 4A, as original sound. This input signal 18 is bandwidth-limited by the telephone set, so that the frequency characteristics are obtained with cut-off towards the high frequency range, as shown in FIG. 4B. If the voice band expanding apparatus disclosed in the Japanese Laid-Open Publication No. 2002-82685 is now applied, the low and high ranges are then excessively be amplified to thereby obtain the voice having the frequency characteristics shown in FIG. 5.

With present embodiment, however, the voice band correcting apparatus 10 operates in a fashion as described above to allow the frequency component level of the input signal 18 to be corrected so as to expand the bandwidth of the input signal, without excessively amplifying the narrow-band input signal during amplifying the digital signal, for example, to provide a high-quality output signal 26 in the speech signal.

Figure 6:
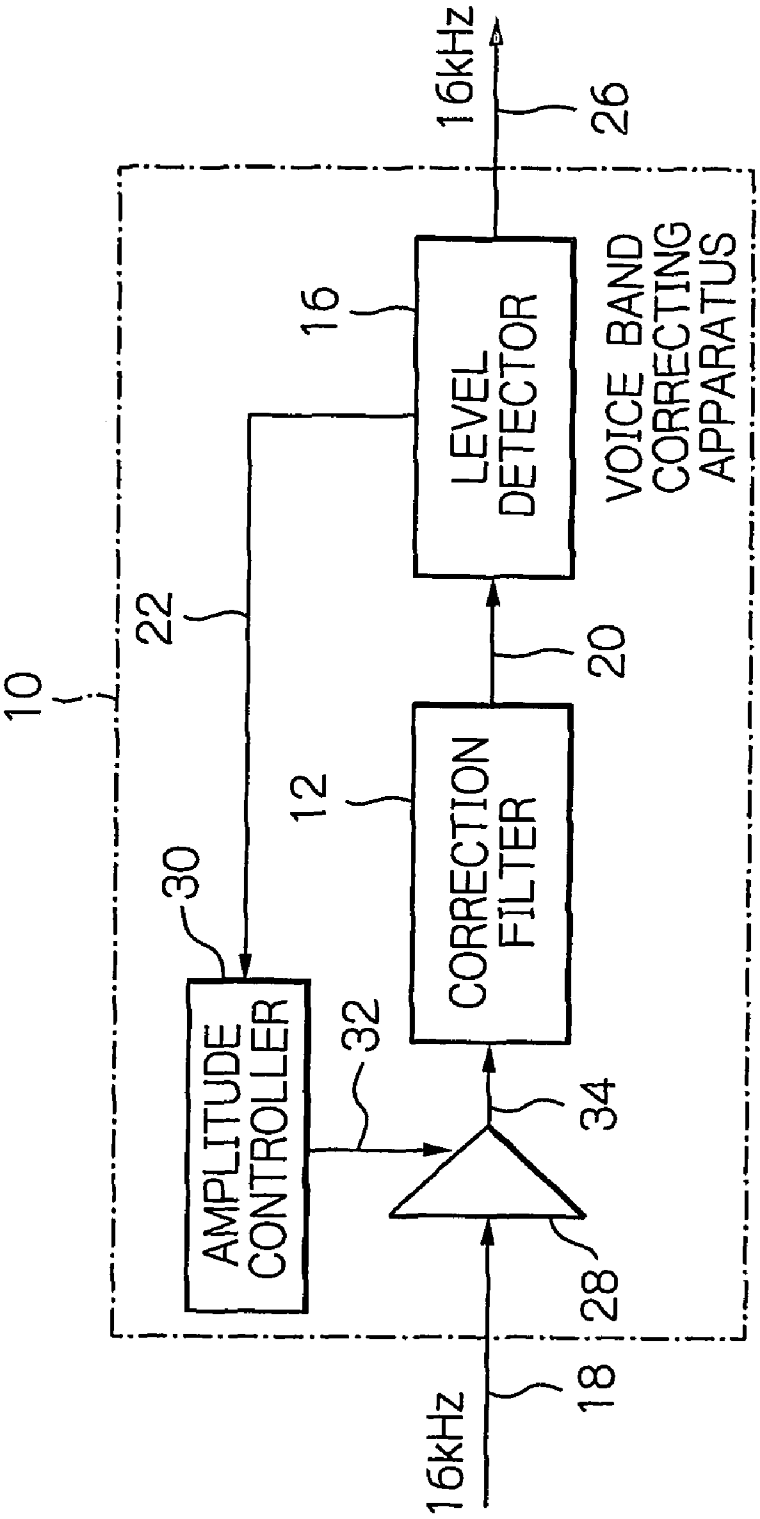
FIGS. 6 and 7 are schematic block diagrams respectively showing the configuration of a first and a second embodiment modified from the voice band correction apparatus of FIG. 1.

The configuration of a first embodiment modified from the voice band correcting apparatus 10 will now be described. In the specification, like parts or components are designated with the same reference numerals and a corresponding description will be omitted for simplicity. Referring to FIG. 6, the voice band correcting apparatus 10 is the same as the previous embodiment except for connecting an amplitude controller 30 to the amplifier 28 to supply an amplitude control signal 32, in order to control the amplitude of the signal 34 input to the correction filter 12 from the outset, instead of controlling the coefficient of the correction filter 12.

The amplifier 28 is adapted to change the amplitude of the input signal 18 and has the function of increasing or decreasing the amplitude of the input signal 18 depending on the value of the amplification factor provided from the amplitude controller 30. In order to prevent the maximum and minimum limitation values from being exceeded in the digital signal processing, the amplitude controller 30 controls the amplitude change of the amplifier 28, responsive to the detection signal 22 output from the level detector 16. The amplifier 28 also has the function of resetting the amplitude to its original value when the output of the correction filter 12 has become lower than the limit value, and of progressively changing the amplitude value depending on the degree of approaching of the amplitude to the limit values. Specifically, a decision is given in dependence on whether or not the output of the correction filter 12 takes the limit value of 16-bit digital representation (+32768 and −32767), as in the previous embodiment. The level detector 16 sends the result of decision as a detection signal 22 to the amplitude controller 30.

The operation of the voice band correcting apparatus 10 of the first embodiment will now be described. The voice signal 18 is limited in the bandwidth to the range of 300 Hz to 3.4 kHz, as shown in FIG. 2A, and is corrupted with noise lying outside this frequency range. The input voice signal 18 is first amplified by the correction filter 12 having the gain characteristics of the frequency shown in FIG. 2B. The amplified, corrected voice signal 20 is supplied from the correction filter 12 to the level detector 16. The level detector 16 monitors the level of the amplified, corrected voice signal 20 and, upon detection that the signal level is approaching or has exceeded a maximum value, outputs the detection signal 22 to the amplitude controller 30. The maximum value for say the 16-bit input signal is 32768. The amplitude controller 30 receives the detection signal 22 from the level detector 16.

The amplitude controller 30 controls over lowering the amplitude of the signal passing the amplifier 28. In the initial state, the amplifier 28 is practically of no avail and does not change the amplitude of the signal. In the present embodiment, the correction filter 12 has the gain characteristics of the frequency shown in FIG. 2B and the gain of the impulse response of 30 dB over the entire frequency. However, this is not to be construed in a limiting fashion. The amplitude controller 30 may be configured for lowering the gain by a decrement of 1 dB responsive to the detection signal 22, again in a non-limiting fashion. Under this control, the input signal 18 is amplified with the noise level suppressed.

By this operation, a narrow band signal may be expanded more spontaneously to a broadband signal, while the filter characteristics may be fixed temporarily. For variations attendant on the lapse of time, the amplitude controller 30 having a simple function of amplification is used, so that it is possible to resolve the software complexity, and further to reduce its scale.

In the above-described two embodiments, the output of the correction filter 12 is monitored to control the coefficient of the correction filter 12 or the amplifier 28 so as to prevent the output signal 26 of the voice band correcting apparatus 10 from reaching its maximum value. However, if the gain of the correction filter 12 is simply reduced, the band of 300 Hz to 3.4 kHz in the input signal 18 is also reduced in its level. Consequently, the sound signal passing through the correction filter 12 is diminished to the extent that a rapid change in presence or reality feeling tends to occur repeatedly whenever the signal level reaches its maximum value. On the other hand, it is a well-known fact that the frequency of the aforementioned electrical noise ranges for example, from 50 Hz to 60 Hz.

Figure 7:
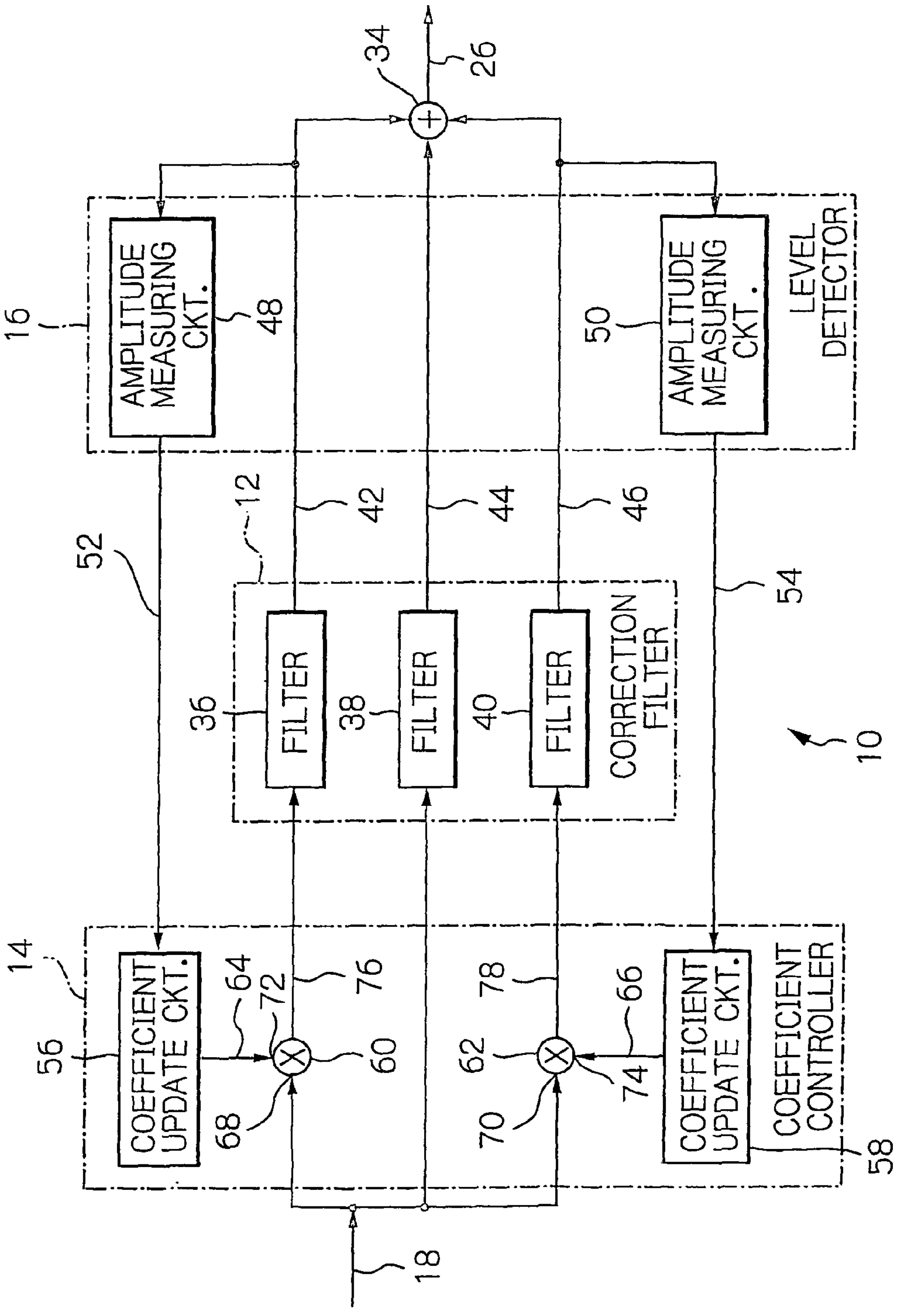

The configuration of a second embodiment will now be described, into which the voice band correcting apparatus 10 is modified. In the present embodiment, the filter is split into filter subsections to adjust the degree of amplification from one band to another. To this end, the voice band correcting apparatus 10 includes the correction filter 12, the coefficient controller 14, the level detector 16 and an adder 34, as interconnected as illustrated in FIG. 7.

The correction filter 12 includes segment filters 36, 38 and 40, in association with the bands A, B and C, respectively. The one filter 36 is a low-pass filter adapted for passing a band of 0 Hz to 300 Hz and cutting a higher frequency component while amplifying the lower frequency range signal. The other filter 38 is adapted for passing an intermediate band of 300 Hz to 3.4 kHz to limit the band of the input signal while adjusting the delay of the lower and higher range signals with respect to the delay of the intermediate band signal. The amount of each delay can be adjusted for example, by simulation on design of these filters. The remaining filter 40 is a high-pass filter adapted for passing the range of 3.4 kHz to 8 kHz and cutting the lower frequency component while amplifying the higher frequency range signal. The filters 36, 38 and 40 output the filtered output signals 42, 44 and 46 to the adder 34, respectively, while supplying the output signals 42 and 46 to amplitude measuring circuits 48 and 50.

The level detector 16 includes the amplitude measuring circuits 48 and 50. These amplitude measurement units 48 and 50 have the function of monitoring the output of the filters 36 and 40 and outputting measured amplitude signals 52 and 54, specifying the state of variation of the corrected output amplitudes, to coefficient update circuits 56 and 58, respectively. In the present embodiment, the level detector 16 verifies whether or not the output value of the filter in the form of digital signal assumes the limit value of 16-bit digital representation, that is, +32768 or −32767. However, the limit values used are not restricted to the above-given specific values, but may, for example, be +16384 or −16384. Any suitable methods may be applicable to determine whether or not these preset values are exceeded, provided that the methods used allow decision as to whether or not a desired level has been reached.

The coefficient controller 14 includes the coefficient update circuits 56 and 58, and multipliers 60 and 62. The coefficient update units 56 and 58 change the coefficients, depending on the measured amplitude signals 52 and 54, and send coefficients 64 and 66 to the multipliers 60 and 62, respectively. The multipliers 60 and 62 are supplied with the input signal 18 at one ends 68 and 70 and with the coefficients 64 and 66 at other ends 72 and 74, respectively, to multiply the input signal 18 with the coefficients 64 and 66 to output multiplied results 76 and 78 to the correction filter 12.

The coefficient update circuits 56 and 58 update no signals in the initial state thereof, because the multipliers 60 and 62 are substantially not in operation in the initial state. The coefficient update units 56 and 58 are responsive to the measured amplitude signals 52 and 54 to change the coefficients 64 and 66 to the multipliers 60 and 62, respectively. Upon having measured an excess amplification, the coefficient update circuits 56 and 58 output an amplitude attenuating coefficient to the multipliers 60 and 62, respectively. This coefficient is not larger than unity and less than zero. The coefficient update circuits 56 and 58 may update the coefficient for lowering the gain at a decrement of 1 dB for the multipliers 60 and 62, respectively, whenever an excess amplification is confirmed in the measured amplitude signals 52 and 54 output from e.g. the amplitude measuring circuits 48 and 50. However, the coefficient updating or gain adjustment is not limited to that described above.

The adder 34 has the function of summing the outputs of the filters 36, 38 and 40 to each other to combine the bands resulting from the splitting (0 Hz to 300 Hz, 300 Hz to 3.4 kHz and 3.4 kHz to 8 kHz).

Figure 8A:
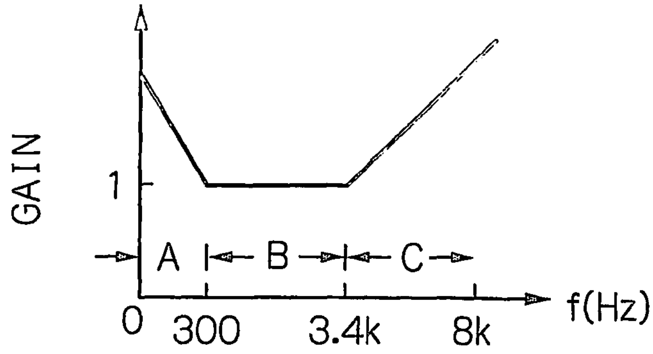
FIGS. 8A through 8D are graphs plotting the frequency characteristics useful for understanding the band correction by the voice band correction apparatus shown in FIG. 7.

The operation of the second embodiment of the voice band correcting apparatus 10 will now be described. Referring to FIG. 8A, when the voice band correcting apparatus is supplied with an input signal 18, limited in bandwidth to the range of 300 Hz to 3.4 kHz, the filters 36, 38 and 40 split the input signal 18 into frequency bands of 0 Hz to 300 Hz, 300 Hz to 3.4 kHz and 3.4 kHz to 8 kHz, respectively, as shown in FIG. 8A.

The filter 36 sends a low-range signal or a lower sub-band signal freed of a high frequency component (0 Hz to 300 Hz) to the amplitude measuring circuit 48. The amplitude measuring circuit 48 monitors the filtered output signal 42 to output the measured amplitude signal 52 to the coefficient update circuit 56. The measured amplitude signal 52 indicates the state of amplitude variation. When the output signal 42 of the filter 36 exceeds the limit value, the coefficient update circuit 56 controls the coefficient supplied to the multiplier 60 responsive to the measured amplitude signal 52. Consequently, the signal of this frequency band is controlled by a signal varied from the gain-representing coefficient 64.

The filter 38, which is adapted for adjusting the delay of the band signal, supplied thereto and limited in bandwidth to the range of 300 Hz to 3.4 kHz, against the low-range and high-range signals, delays the band signal. The aim of delaying the signal, passing through the filter 38, is to prevent the lowering of the signal level passing through the filter 38 and not to detract from the reality felt with the emitted, audible sound.

Figure 8B:
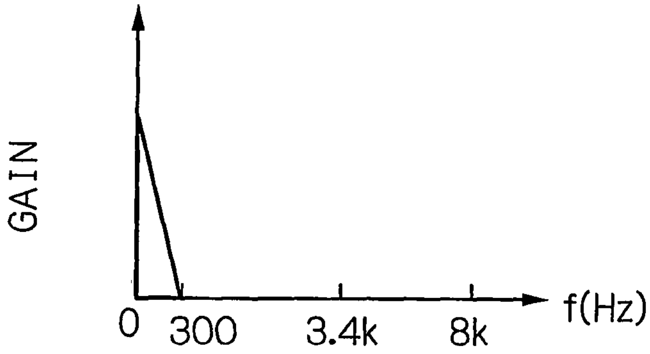
Figure 8C:
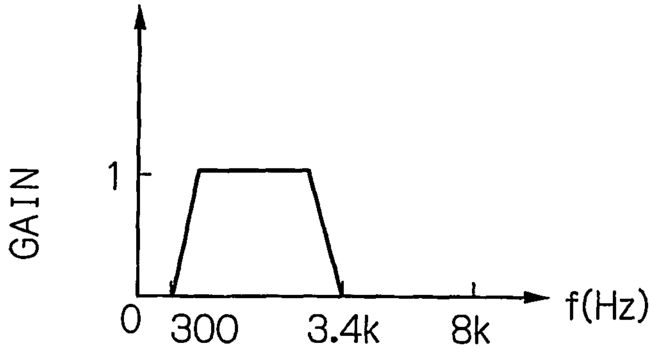
Figure 8D:
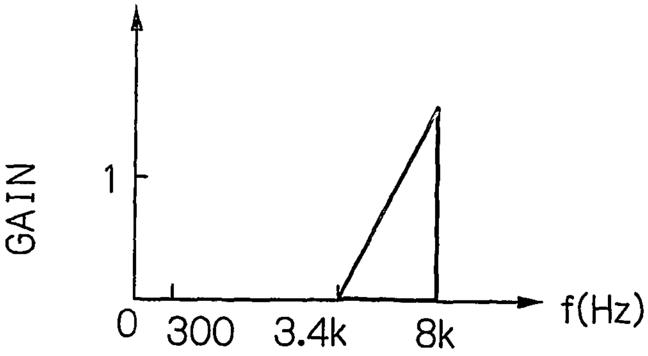

The filter 40 forms the high-range signal or higher sub-band signal freed of the low-range signal 46 (3.4 kHz to 8 kHz), as shown in FIG. 8D, to send the thus filtered signal to the amplitude measuring circuit 50. The amplitude measuring circuit 50 monitors the filtered output signal 46 to deliver the measured amplitude signal 54 to the coefficient update circuit 58. The measured amplitude signal 54 specifies the state of amplitude variation. If the output of the filter 40 exceeds the limit value, the coefficient update circuit 58 is responsive to the measured amplitude signal 54 to control the coefficient 66 to be supplied to the multiplier 62.

The correction filter 12 sends the filter outputs 42, 44 and 46 to the adder 34 to combine the bands obtained on splitting (0 Hz to 300 Hz, 300 Hz to 3.4 kHz and 3.4 kHz to 8 kHz). If the processing mentioned above corrects only the low range to cause the output signal 26 to have excessively larger amplitude, the gain may then be reduced. The same may be said of the high frequency range. Since the intermediate range is inherently not bandwidth-limited, the signal of this range is simply passed through for not changing the signal level. Thus, the gain is fixed at 1.0.

When the input signal 18 is corrupted with the noise as shown in FIG. 2A, it is only sufficient to reduce the gain of the filters 36 and 40. Since the gain of the intermediate range is set to 1.0, the sound is not appreciably affected in volume. With the ordinary voice, affected by noise only to a limited extent, the input to the filters 36 and 40 is extremely small, so that, even though the input is multiplied with the associated gain value, the signal level with the gain 1.0 is not exceeded. It is also possible to give the gain (<1.0) to the amplitude of the original signal depending on the magnitude of the output of the filters 36 and 40.

By this operation, the frequency amplification factor is automatically determined for each frequency range. In distinction from the first embodiment, if the background noise suffers from an offset in frequency characteristics, e.g. noise is localized only in the low frequency range, the high range may then be expanded without being affected by the noise, and hence the voice range may be expanded with the spontaneous sound quality. The same effect may be obtained from the high range as well.

Figure 9:
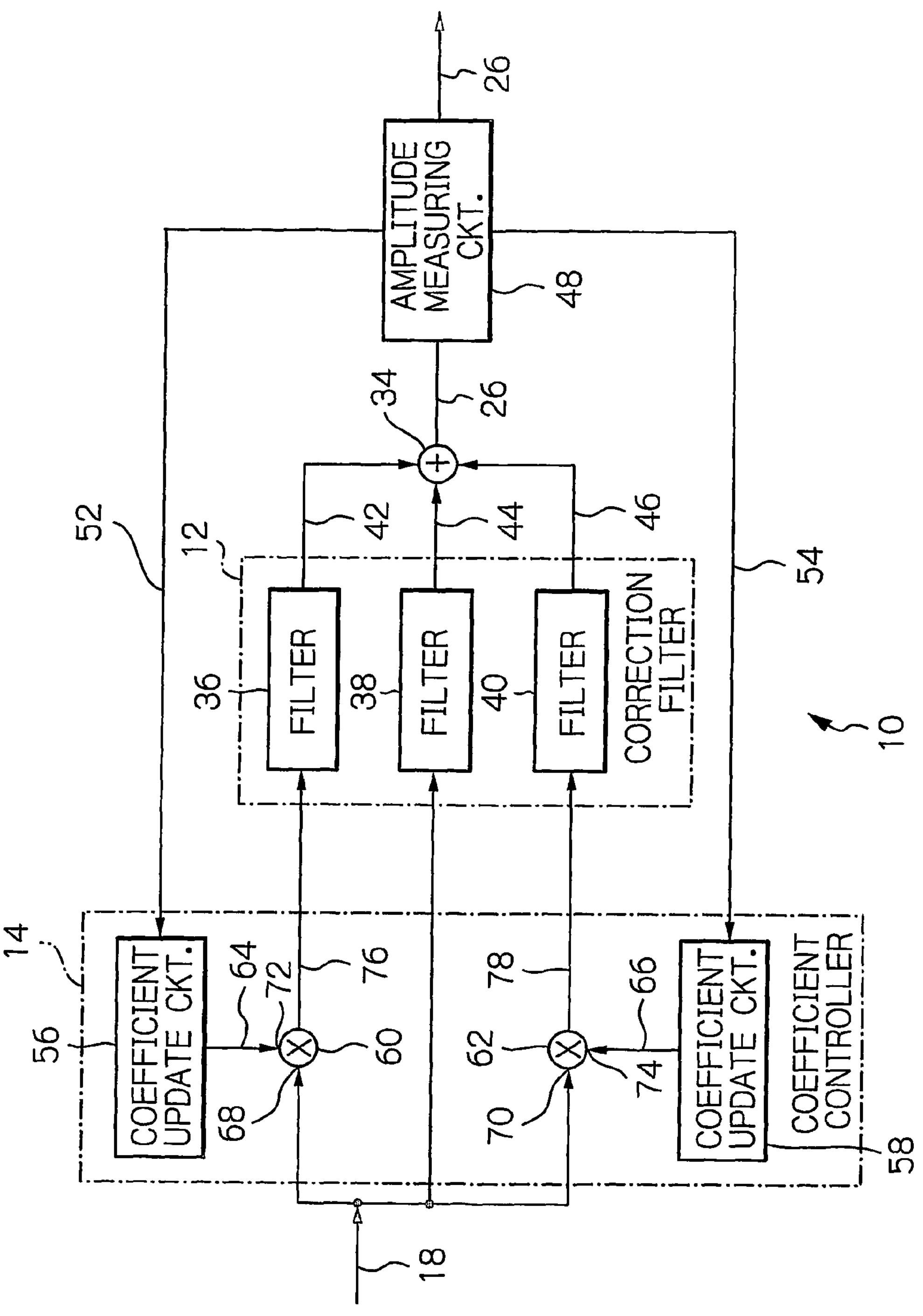
FIG. 9 is a schematic block diagram showing a configuration modified from the second embodiment of FIG. 7.

In the present embodiment, the level detector 16 is disposed on the input side of the adder 34 and is included in the amplitude measuring circuits 48 and 50. However, the amplitude measuring circuit 48 may alternatively be provided at the output side of the adder 54, as shown in FIG. 9. The amplitude measuring circuit 48 may be adapted to supply a measured result of the corrected output signal 26 from the adder 34 to both the coefficient update circuits 56 and 58 and to pass the output signal 26 to the output 26 of the voice band correcting apparatus 10. This can simplify the corresponding circuitry into the sole amplitude measuring circuit 48 from the level detector 16, FIG. 7.

The configuration of a third embodiment modified from the voice band correcting apparatus 10 will now be described. In the second embodiment, the gain value of the filters 36 and 40 tends to broadly range from its negative to positive, to render the designing difficult. The configuration, which possibly copes with this difficulty, is described on the third embodiment. The voice band correcting apparatus 10 separates the frequency band into a low and a high range, by an FIR (finite impulse response) filter, and processes a signal with the filter as in the second embodiment to overcome the difficulty otherwise encountered in the designing.

Figure 10:
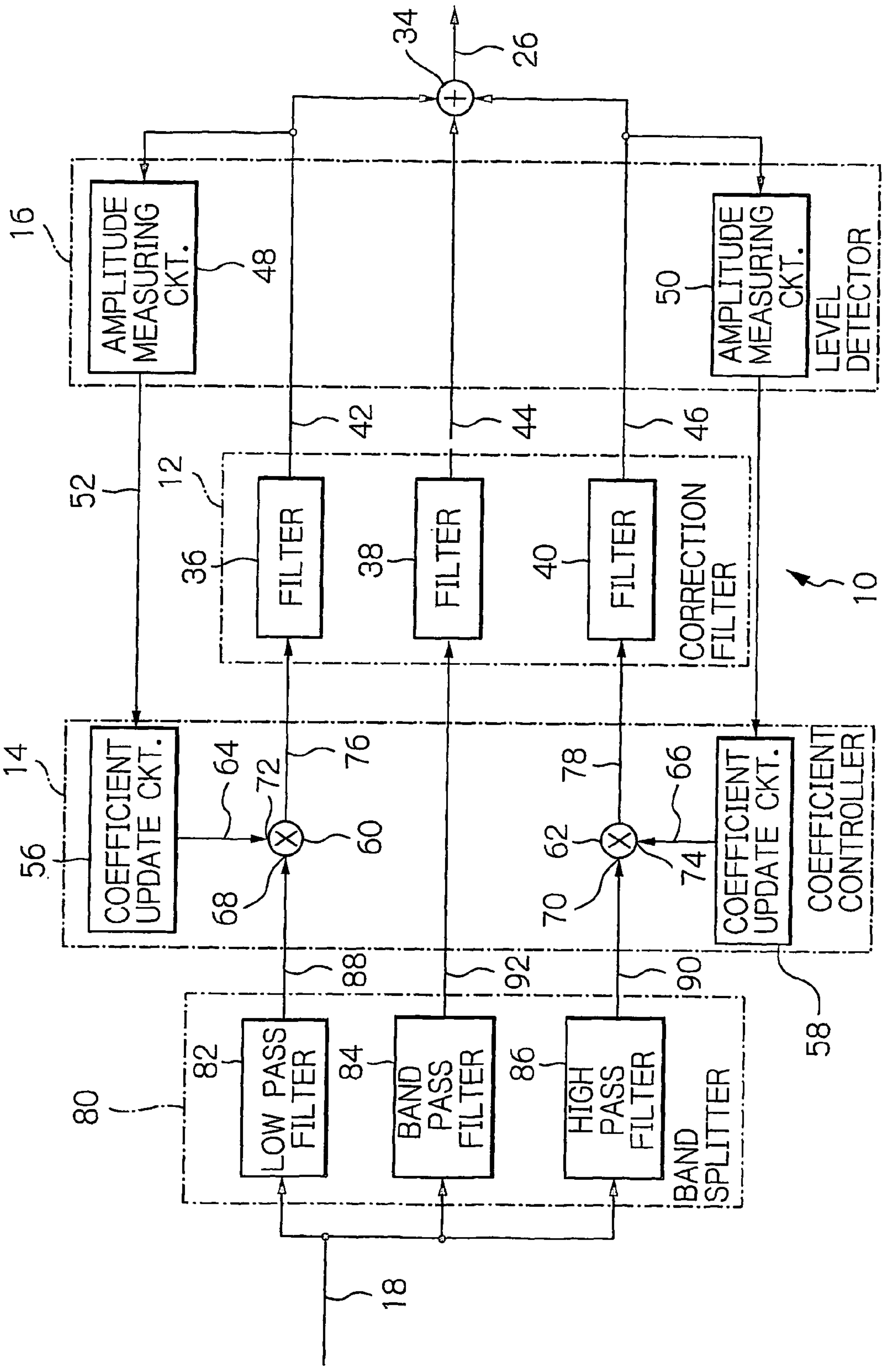
FIG. 10 is a schematic block diagram showing the configuration of a third embodiment modified from the voice band correction apparatus of FIG. 1.

Referring now to FIG. 10, the voice band correcting apparatus 10 includes a band splitter 80, in addition to the components of the second embodiment. The band splitter 80 includes a low-pass filter 82, an intermediate filter 84 and a high-pass filter 86, as interconnected as illustrated.

The low-pass filter 82 is e.g. an FIR filter for cutting the high frequency component ranging from 3.4 kHz to 8 kHz. The intermediate filter 84 is adapted for passing the intermediate frequency of 300 Hz to 3.4 kHz to limit the band of the input signal, while adjusting the delay of the low frequency and high frequency signals with respect to the intermediate frequency signal. The intermediate filter 84 can be adjusted with the delay of the filter 38 taken into account with respect to the low and high frequency signals, for example, by a simulation made during designing these filters. The high-pass filter 86 is e.g. an FIR filter and cuts the low frequency component of 0 Hz to 300 Hz. The low-pass filter 82 and the high-pass filter 86 supply filtered signals 88 and 90 to the multipliers 60 and 62, respectively, while the intermediate filter 84 outputs a filtered signal 92 to the filter 38.

The filter 36 in the present embodiment amplifies a low frequency signal ranging from 0 Hz to 300 Hz. The filter 38 is adapted for passing the intermediate frequency of 300 Hz to 3.4 kHz to limit the band of the input signal, while adjusting the delay of the low and high frequency signals with respect to the delay of the intermediate frequency signal. The intermediate filter 84 may be adjusted with the delay of the filter 38 taken into account. The filter 40 amplifies the high frequency signal of the range of 3.4 kHz to 8 kHz.

In the present embodiment, the multiplier 60 multiplies the output 88 from the low-pass filter 82 and the coefficient 64 from the coefficient update circuit 56 to output the result of multiplication 76 to the filter 36. The multiplier 62 multiplies the output 90 of the high-pass filter 86 with a coefficient 66 from the coefficient update circuit 58 to output the result of multiplication 78 to the filter 40.

The operation of the third embodiment of the voice band correcting apparatus 10 will now be described. When the voice band correcting apparatus 10 is supplied with an input signal 18, limited in bandwidth to the range of 300 Hz to 3.4 kHz, the low-pass filter 82, the intermediate filter 84 and the high-pass filter 86 split the input signal into frequency bands of 0 Hz to 300 Hz, 300 Hz to 3.4 kHz and 3.4 kHz to 8 kHz. The low frequency signal (0 Hz to 300 Hz) 88, freed of the high frequency signal, is amplified by the filter 36. The output signal 42, thus amplified, is monitored by the amplitude measuring circuit 48. If the output of the filter 36 exceeds the limit value, the coefficient update circuit 56 controls the coefficient 64, supplied to the multiplier 60, responsive to the measured amplitude signal 52.

The input signal 92, bandwidth-limited to the range of 300 Hz to 3.4 kHz by the intermediate filter 84, is delayed to adjust the delay of the output signal 88 of the low-pass filter 82 and the output signal 90 of the high-pass filter 86 with respect to the delay of the intermediate output signal 92. The aim of delaying the signal, passing through the filter 38, is to prevent the lowering of the signal level passing through the filter 38 and not to detract from the reality felt from the emitted, audible sound.

The high frequency signal (3.4 kHz to 8 kHz) 90, free from the low range by the filter 86, is amplified by the filter 40. The amplified output signal 46 is monitored by the amplitude measuring circuit 50. If the output of the filter 40 exceeds the limit value, the coefficient update circuit 58 controls the coefficient 66, supplied to the multiplier 62, responsive to the measured amplitude signal 54. The correction filter 12 sends the filter outputs 42, 44 and 46 to the adder 34 for summation, in order to combine the bands (0 Hz to 300 Hz, 300 Hz to 3.4 kHz and 3.4 kHz to 8 kHz) obtained on splitting.

With this embodiment, the three filters 82, 84 and 86, splitting the frequency band, are separately disposed from the correction filter 12, adapted for correcting the filter outputs 88, 90 and 92, respectively, and operable as stated above. It is therefore generally sufficient for the correction filter 12 to take into account the gain only on the positive side, such that the limited number of positive and negative quantization steps may be designed more flexibly to assure spontaneous signal correction which does not detract from the sound feeling.

Figure 11:
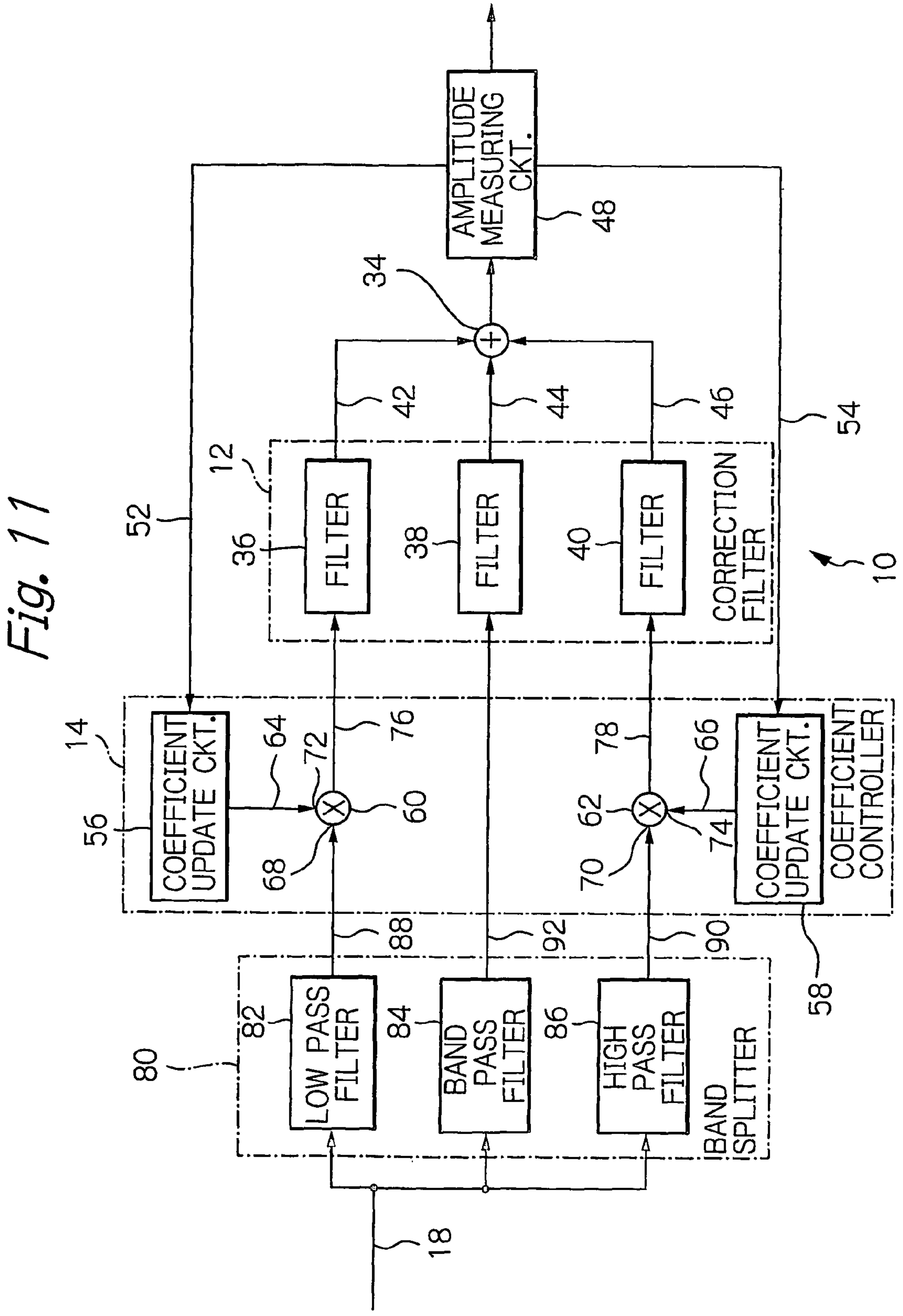
FIG. 11 is a schematic block diagram showing a configuration modified from the third embodiment of FIG. 10.

In the present embodiment, the level detector 16 is disposed at the input side of the adder 34 and is included in the amplitude measuring circuits 48 and 50. However, the amplitude measuring circuit 48, shown in FIG. 11, is included at the output side of the adder 34. The amplitude measuring circuit 48 may supply a measured result of the corrected output signal 26 from the adder 34 to both the coefficient update circuits 56 and 58 and to pass the output signal 26 as an output 26 of the voice band correcting apparatus 10. This can simplify the corresponding circuitry into the sole amplitude measuring circuit 48 from the level detector 16, FIG. 10.

The voice band correcting apparatus 10 of a fourth embodiment, which splits the input signal 18 into two portions by a quadrature mirror filter (QMF) used in the ITU-T (International Telecommunication Union Telecommunication standardization sector) recommendations G.722, will hereinafter be described with reference to FIG. 12.

The ITU-T recommendations G.722 provides for an audio encoding system (50 Hz to 7 kHz), as used for a variety of high-quality speech signals. This regulated encoding system uses the SB-ADPCM (Sub-Band Adaptive Differential Pulse Code Modulation) under a bit rate of 64 kbit/second. With the SB-ADPCM technique, the frequency band is split into two sub-bands, namely a high and a low range, using the quadrature mirror filter. A signal within the respective bands is encoded through the ADPCM.

Figure 12:
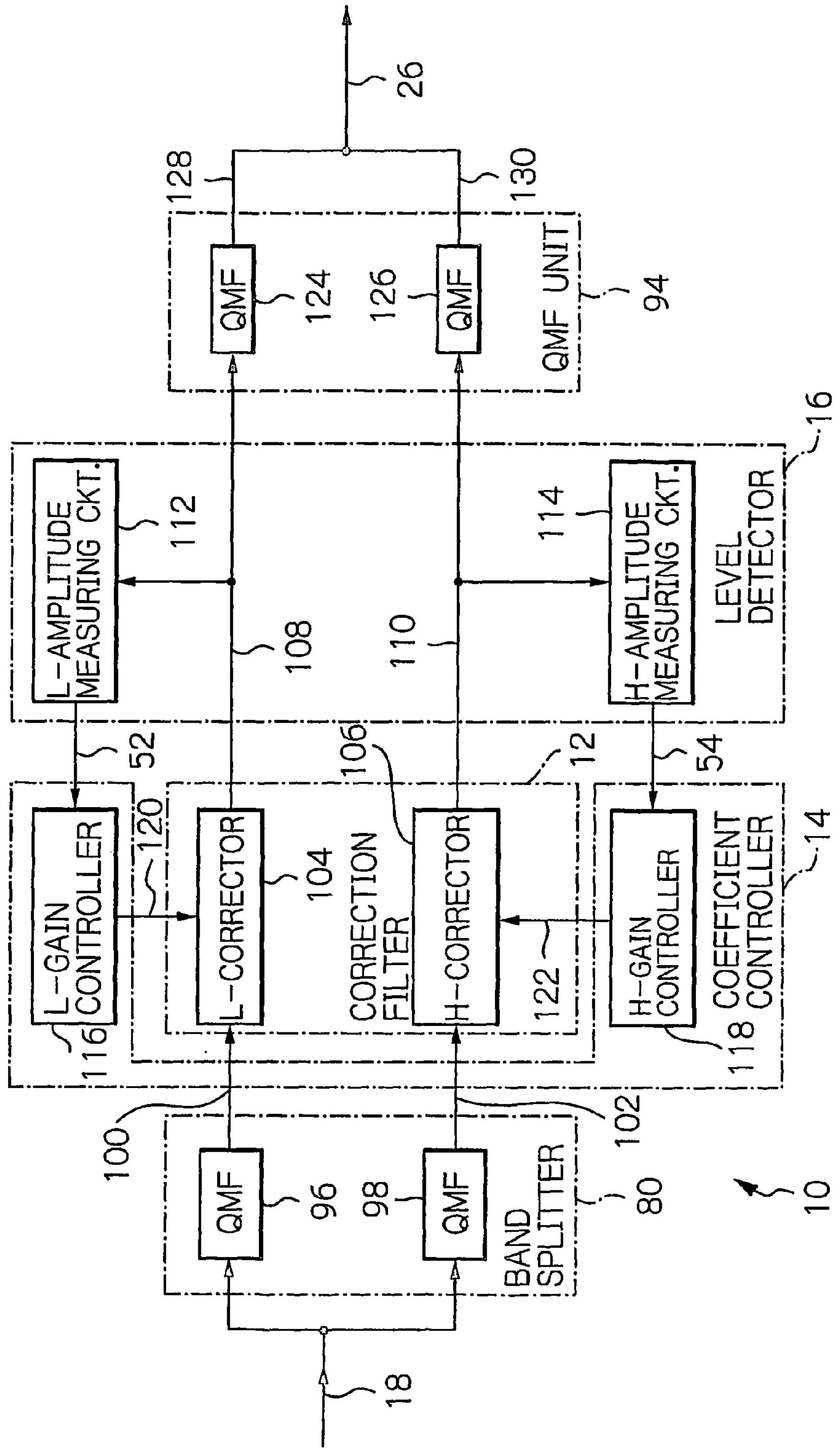
FIG. 12 is a schematic block diagram showing the configuration of a fourth embodiment modified from the voice band correction apparatus of FIG. 1.

The voice band correcting apparatus 10, shown in FIG. 12, is basically patterned after the configuration of the third embodiment, shown in FIG. 8, and further includes a quadrature mirror filter (QMF) unit 94 in this configuration. Specifically, the voice band correcting apparatus 10 includes the quadrature mirror filter unit 94, in addition to the band splitter 80, correction filter 12, coefficient controller 14 and level detector 16.

The band splitter 80 includes quadrature mirror filters 96 and 98 interconnected as illustrated. These quadrature mirror filters 96 and 98 are linear-phase, non-recursive digital filters adapted to split the frequency sub-band of 0 Hz to 8 kHz into two sub-bands, namely a low frequency sub-band of 0 Hz to 4 kHz and a high frequency sub-band of 4 kHz to 8 kHz. The input signal 18 to the filters is sampled at the frequency of 16 kHz. The quadrature mirror filters 96 and 98 sample a low-range output signal 100 and a high-range output signal 102 with the sampling frequency of 8 kHz to output the sampled output signals to the correction filter 12.

The correction filter 12 has a low-range corrector 104 and a high-range corrector 106 interconnected as shown. The low-range corrector 104 is e.g. an FIR filter and has the function of amplifying a low-range signal of 0 kHz to 4 kHz. The low-range corrector 104 is preferably a filter having the characteristics of filters combined, which correct e.g. the bands A and B shown in FIG. 2B. Specifically, this may be implemented by combining the characteristics shown in FIGS. 8B and 8C, only by way of example.

The high-range corrector 106 is also an FIR filter adapted to amplify a high-range signal of from 4 kHz to 8 kHz. Preferably, a filter having the characteristics shown in FIG. 8D is applicable to the high-range corrector 106, only by way of example. However, the high-range corrector 106 is not limited to this specific corrector. The low-range corrector 104 and the high-range corrector 106, included in the correction filter 12, provide both the level detector 16 and the QMF unit 94 with an output signal 108, corresponding to a combination of the output signals 42 and 44 of FIG. 7, and an output signal 110, corresponding to the output signal 46 of FIG. 7, respectively.

The level detector 16 includes a low-range amplitude measuring circuit 112 and a high-range amplitude measuring circuit 114. The low-range amplitude measuring circuit 112 has the function of monitoring the output signal 108 of the low-range corrector 104 to output a measured amplitude signal 52 representative of the state of amplitude variations of the corrected output signal 108. The high-range amplitude measuring circuit 114 has the function of monitoring the output signal 110 of the high-range corrector 106 to output a measured amplitude signal 54 representing the state of amplitude variations of the corrected output signal 110.

In the present embodiment, it is checked whether or not the output value of the low-range corrector 104 or high-range corrector 106 in the form of digital signal assumes the limit value of 16-bit digital representation, that is, +32768 or −32767. However, the limit values used are not limited to the above given specific values, but may, for example, be +16384 or 16384, in which case it is verified whether or not one of the threshold values is exceeded. Any suitable methods may be used to determine whether or not these preset values are exceeded, provided that the methods used allow decision as to whether or not the desired level has been reached.

The coefficient controller 14 includes a low-range gain controller 116 and a high-range gain controller 118. Neither the low-range gain controller 116 nor the high-range gain controller 118 performs control in the initial state. The low-range gain controller 116 has filter characteristics, into which the characteristics of FIGS. 8B and 8C are combined with each other. If the output signal 108 of the low-range corrector 104 exceeds the limit value, the low-range gain controller 116 controls to decrease the amount of amplitude correction 120 by 1 dB, responsive to the measured amplitude signal 52, to output the resulting signal. The system may be adapted to decrement only the component shown in FIG. 8B by 1 dB. The filter characteristics are not limited to the combined characteristics shown in FIGS. 8B and 8C.

The high-range corrector 106 is of the filter characteristics shown in FIG. 8D. If the output signal of the high-range corrector 106 exceeds the limit value, the high-range gain controller 118 controls to decrease by 1 dB the amount of amplitude correction 122, to be supplied to the high-range corrector 106, responsive to the measured amplitude signal 54, to output the resulting signal. That is a mere example for illustration.

The QMF unit 94 includes quadrature mirror filters 124 and 126. These quadrature mirror filters 124 and 126 are linear-phase, non-recursive digital filters and interpolate the outputs of SB-ADPCM decoders of the low and high frequency ranges, not shown, for converting the 8 kHz-sampled signals 108 and 110 into 16 kHz-sampled signals 128 and 130. The voice band correcting apparatus 10 ultimately combines the output signals 128 and 130 of the QMF unit 94 with each other to generate an output signal 26 sampled at the frequency of 16 kHz.

Although not shown, the amplitude measuring circuit 48 may be provided on the downstream of the summation. The amplitude measuring circuit 48 may adapted to supply a measured result to both the coefficient update units 56 and 58 and pass the output signal 26 as the apparatus output 26. This can simplify the corresponding circuitry into the sole amplitude measuring circuit 48 from the level detector 16, FIG. 10.

The operation of the fourth embodiment of the voice band correcting apparatus 10 will now be described. The input signal 18 of the frequency band of 0 Hz to 8 kHz, sampled at the frequency of 16 kHz, is supplied to the band splitter 80. This band splitter 80 limits the high frequency range of the input signal 18 by the quadrature mirror filter 96 to supply the signal of the frequency band of 0 Hz to 4 kHz sampled at the frequency of 8 kHz to the low-range corrector 104. The sampled signal 100 is amplified by the low-range corrector 104.

The amplified signal 108 is monitored by the low-range amplitude measuring circuit 112. This low-range amplitude measuring circuit 112 outputs the measured amplitude signal 52 to the low-range controller 116. In particular, if the output signal 108 of the low-range corrector 104 exceeds the limit value, the low-range gain controller 116 controls the amount of amplitude correction 120, output to the low-range corrector 104, responsive to the measured amplitude signal 52 supplied. The output signal 108 of the low-range corrector 104 interpolates the output of the low-range SB-ADPCM decoder, not shown, by the quadrature mirror filter 124, to convert the 8 kHz-sampled signal into 16 kHz-sampled signal. The quadrature mirror filter 124 sends out the output signal 128 sampled at the frequency of 16 kHz.

The same is applied to the high frequency band. More specifically, the input signal 18 of the frequency band of 0 Hz to 8 kHz, sampled at the frequency of 16 kHz, is supplied to the quadrature mirror filter 98. The quadrature mirror filter 98 limits the low frequency band of the input signal 18 to output the signal 102 of the range of 4 Hz to 8 kHz sampled at the frequency of 8 kHz to the high-range correcting unit 106. The output signal 102 is amplified by the high-range corrector 106.

The amplified signal 10 is monitored by the high-range amplitude measuring circuit 114. This high-range amplitude measuring circuit 114 outputs the measured amplitude signal 54 to the high-range gain controller 118. In particular, if the output signal 110 of the high-range corrector 106 exceeds the limit value, the high-range gain controller 118 is responsive to the measured amplitude signal 54 supplied to control the amount of amplitude correction 122, which is to be output to the high-range corrector 106. The output signal 110 of the high-range corrector 106 interpolates the output of the high-range SB-ADPCM decoder, not shown, by the quadrature mirror filter 126, to convert the 8 kHz-sampled signal into 16 kHz-sampled signal. The quadrature mirror filter 126 sends out the output signal 130 sampled at the frequency of 16 kHz.

In addition, a filter may be provided between the quadrature mirror filter 96 and the low-range corrector 104 to correct the sub-band of the range of 0 Hz to 340 Hz of the output of the filter 96 by the low-range corrector 104, as the range of 340 Hz to 4 kHz is output without correcting the sub-band. The specific operation in this case is the same as that of the second embodiment.

By this operation, the voice band may be expanded by using a quadrature mirror filter instead of a band splitter having a frequency-separating filter. Specifically, in an application in which the transmission channel transmits a signal dedicated for broadband application, it is possible to improve the sound quality of an output signal handled by a conventional telephone set. Moreover, since the frequency correction is made for respective low and high range components, high-quality speech signal transmission becomes available by expanding the sound quality of the conventional telephone set to a spontaneous voice band even in the case ITU-T Recommendations G.722 quadrature mirror filters, for example, have to be used for conformity to the standard.

Figure 13:
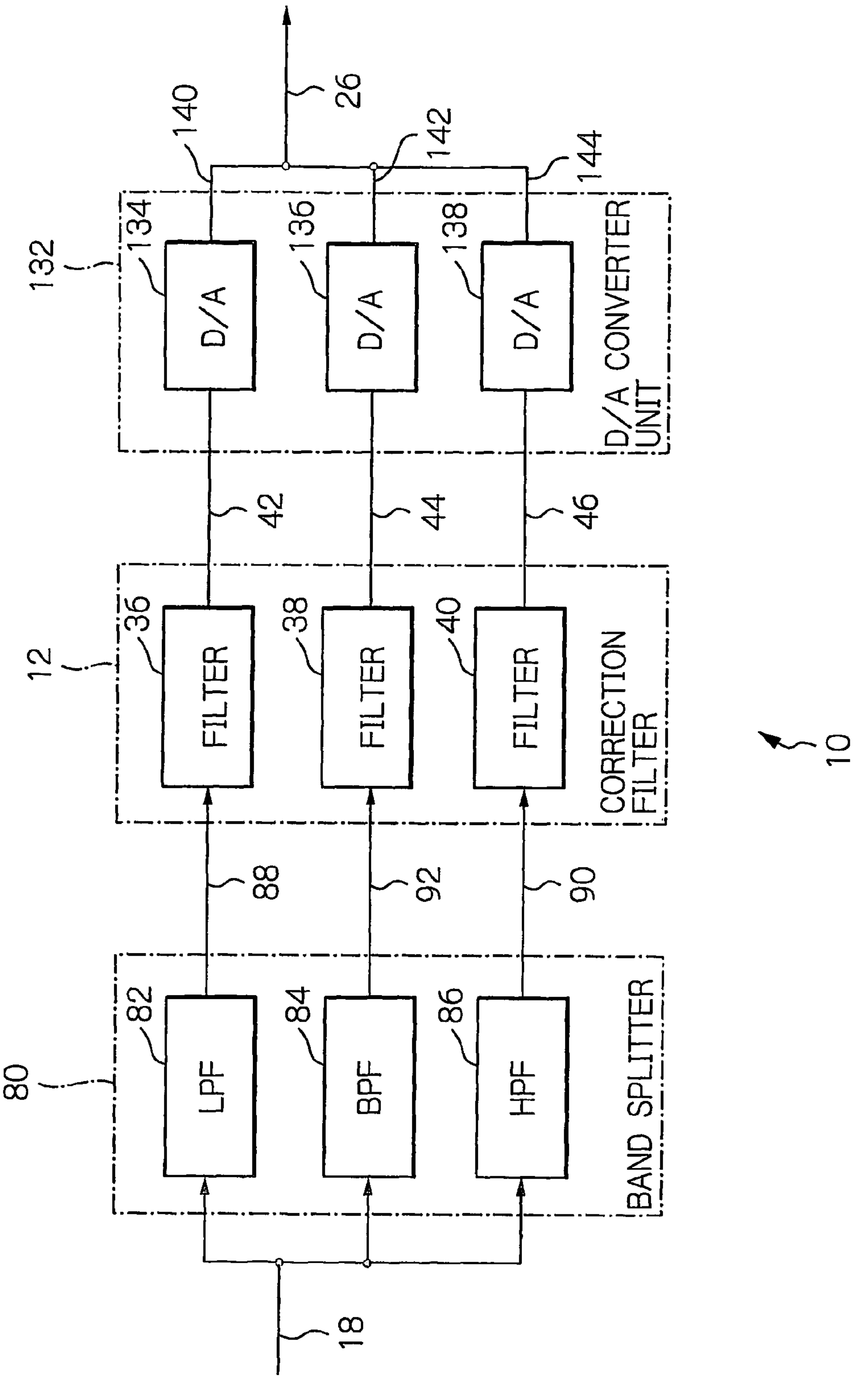
FIG. 13 is a schematic block diagram showing the configuration of a fifth embodiment modified from the voice band correction apparatus of FIG. 1.

The configuration of a fifth embodiment of the voice band correcting apparatus 10 will now be described. The present embodiment is basically the same in configuration as the third embodiment shown in FIG. 10, and is featured by having neither the coefficient controller 14 nor the level detector 16. The voice band correcting apparatus 10 includes a frequency spectrum splitter 80, a correction filter 12 and a D/A converting unit 132, interconnected as shown in FIG. 13.

The band splitter 80 includes the low-pass filter 82, the intermediate filter 84 and the high-pass filter 86, while the correction filter 12 includes three filters 36, 38 and 40, in a manner similar to the third modification. The correction filter 12 adjusts the gain of amplification, based on the value supplied in the digital signal processing, and amplifies the amplitude to for example the maximum value of the digital signal. The D/A converting unit 132 is made up by D/A converters 134, 136 and 138 for converting three output signals (digital signals) 42, 44 and 46, received from the correction filter 12, to corresponding analog signals.

The operation of the fifth embodiment of the voice band correcting apparatus 10 will now be described. When the input signal 18, band-limited to 300 Hz to 3.4 kHz, is supplied, the input signal 18 is split into sub-bands of 0 Hz to 300 Hz, 300 Hz to 3.4 kHz and 3.4 kHz to 8 kHz, by the low-pass filter 82, the intermediate filter 84 and the high-pass filter 86. The output signal 88 of the low-pass filter 82 (0 Hz to 300 Hz) is amplified by the filter 36. This amplified signal 42 is converted by a D/A converter 134 into a corresponding analog signal 140. The output signal 92 of the intermediate filter 84 is delayed by the filter 38 for adjusting the delay of the output of the low-pass filter 82 and the high-pass filter 86 with respect to the delay of the output signal 92. The output signal 44 is converted by the D/A converter 136 into a corresponding analog signal 142. The output signal 90 of the high-pass filter 86 (3.4 kHz to 8 kHz) is amplified by the filter 40. The amplified signal 46 is converted by the D/A converter 138 into an analog signal 144.

The outputs 140, 142 and 144 of the D/A converters 134, 136 and 138 are summed to each other and the bands resulting from the splitting (0 Hz to 300 Hz, 300 Hz to 3.4 kHz and 3.4 kHz to 8 kHz) are combined together. By this combination, the voice band correcting apparatus 10 performs the correction to expand the band of the band-limited input signal 18 to the broadband to output the resulting signal as the output signal 26.

Thus, based on the presupposition that the input signal has been separated in advance into the low, middle and high frequency bands by the band splitter 80, and the amplitude is corrected in each of the separated bands, the present embodiment amplifies the amplitude of the signals 88, 92 and 90, split from band to band, to the maximum value of the digital signal in the range of the digital signal processing of the correction filter 12, and then converts the digital signal into analog signal and sums the signal of the respective bands together. This becomes possible by exploiting the fact that there is no limitation to the summed value in the domain of the analog signal processing where there is no limitation to the summed value. Since the summation is made in the area of analog signal where there is no upper limit to the summation, it is possible to enlarge the voice band, even in the case the amplitude becomes very large as a result of the summation, as the spontaneous sound quality free of limitation of digital summation is maintained.

Figure 14:
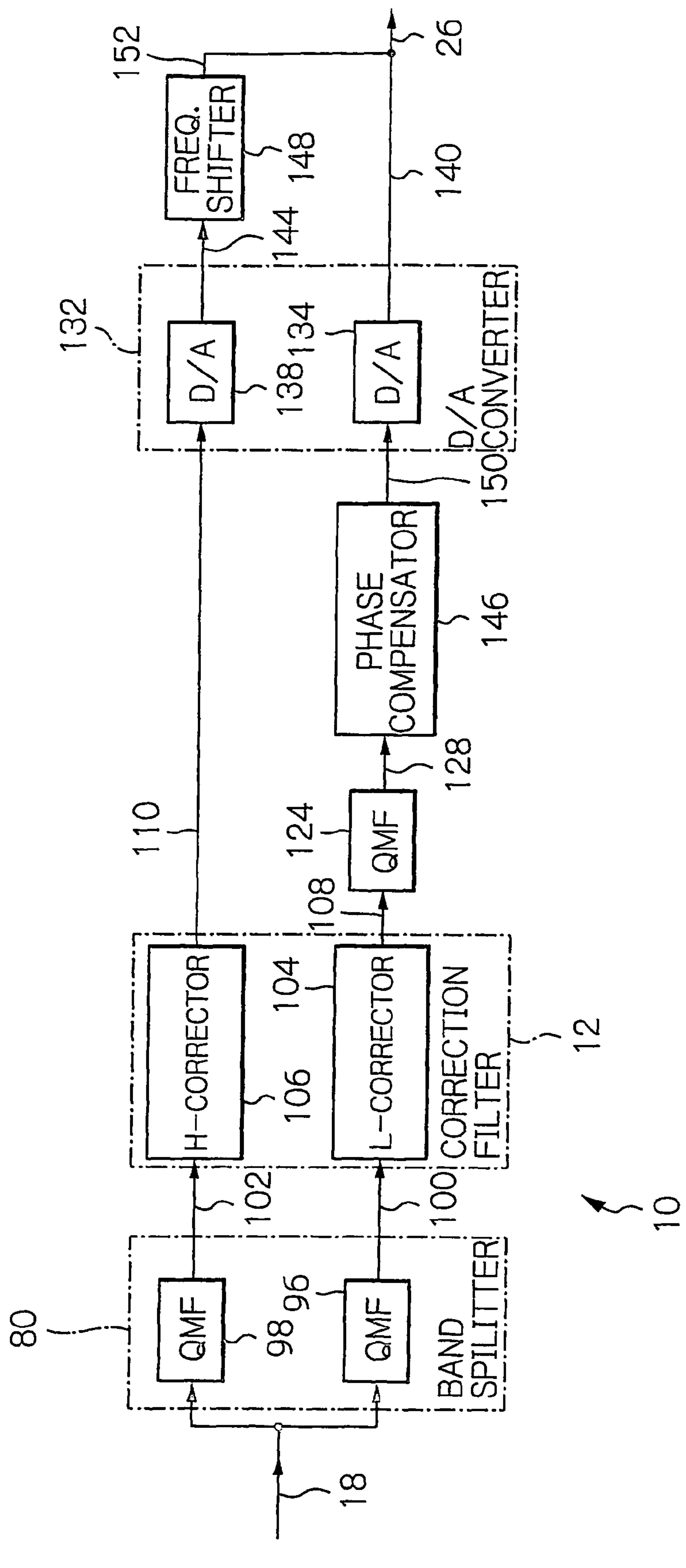
FIG. 14 is a schematic block diagram showing the configuration of a sixth embodiment modified from the voice band correction apparatus of FIG. 1.

The configuration of a sixth embodiment will now be described, which applies the fifth embodiment to the voice band correcting apparatus 10, employing the ITU-T recommendations G.722, described in connection with the fourth embodiment. Referring to FIG. 14, the voice band correcting apparatus 10 includes the band splitter 80, the correction filter 12, the quadrature mirror filter 124, a phase compensator 146, the D/A converting unit 132 and a frequency shifter 148.

The band splitter 80 includes the quadrature mirror filters 96 and 98 interconnected as illustrated. These quadrature mirror filters 96 and 98 are linear-phase, non-recursive digital filters adapted to split the frequency band of 0 Hz to 8 kHz of the input signal 18 into two portions, namely a low frequency sub-band of 0 Hz to 4 kHz and a high frequency sub-band of 4 kHz to 8 kHz. The input signal 18 to the filters is sampled at the frequency of 16 kHz. The quadrature mirror filters 96 and 98 sample the low-range output signal 100 and the high-range output signal 102 with the frequency of 8 kHz to output the sampled signals.

The correction filter 12 has a low-range corrector 104 and a high-range corrector 106 interconnected as shown. The low-range corrector 104 is specifically of frequency characteristics, into which the frequency characteristics of FIGS. 8B and 8C are combined with each other. The high-range corrector 106 may have the filter characteristics shown in FIG. 8D. The low-range corrector 104 and the high-range corrector 106 send out the respective output signals 108 and 110, amplified on the basis of the input value, to the quadrature mirror filter 124 and to the D/A converter 138.

The quadrature mirror filter 124 may be adapted to send out the frequency component of e.g. 0 Hz to 340 kHz of the supplied output signal 108 to the phase compensator 146, while outputting the frequency component of 340 Hz to 4 kHz without correction. This facilitates the designing of the correction filter 12, as with the second embodiment. The quadrature mirror filter 124 sends out the output signal 128 to the phase compensator 146. Since the low-range signal, specifically the signal of 0 Hz to 4 kHz, has already been acquired, the quadrature mirror filter 124 may be dispensed with, for reducing the scale of the apparatus, provided that coincidence of only the phase or the delay on the high range correcting channel is achieved. The reason is that the quadrature mirror filter 124 takes charge of conversion from the signal of 0 Hz to 4 kHz to the signal of 0 Hz to 4 kHz, thus performing no substantial frequency conversion.

The phase compensator 146 compensates e.g. the phase if phase delay or the like is caused to the high range signals 152 from frequency shifter 148 due to frequency shifting. This frequency shifting will be described subsequently. If delay or phase change due to the frequency shifting is not caused, frequency shifting may be omitted. As the phase compensator

146, a delay register is preferably used. There is no limitation to the phase compensator 146 if both the delay and the phase change may thereby be compensated. The phase compensator 146 outputs the phase-managed output signal 150 to the D/A converter 134.

The D/A converting unit 132 has the D/A converters 134 and 138 for low and high frequency ranges, respectively, interconnected as shown. The D/A converter 138 converts the output signal 110 from the high-range corrector 106 into an analog signal 144, which is then sent to the frequency shifter 148. This frequency shifter 148 frequency-shifts the analog signals 144. Since the signal processing by the quadrature mirror filter is equivalent to frequency-shifting the signal component of 4 kHz to 8 kHz in the signal sampled at the frequency of 16 kHz towards the lower frequency side, the processing is performed of ultimately restoring the signal to the higher frequency side of 4 kHz to 8 kHz. The voice band correcting apparatus 10 combines the output signals 140 and 152 from the D/A converter 134 and the frequency shift unit 148 with each other to output the combined output signal 26.

The operation of the sixth embodiment of the voice band correcting apparatus 10 will now be described. The input signal 18 of the frequency band of 0 Hz to 8 kHz, sampled at the frequency of 16 kHz, is supplied to the quadrature mirror filters 96 and 98. The input signal 18 has its high frequency range limited by the quadrature mirror filter 96. The quadrature mirror filter 96 samples the signal of the frequency band of 0 Hz to 4 kHz, with the frequency of 8 kHz, to send out the output signal 100 to the low-range corrector 104. The output signal 100 is amplified by the low-range corrector 104.

The signal 108, amplified in the present embodiment, is supplied to the quadrature mirror filter 124. The filter 124 sends out the signal 128 of the bands of 0 Hz to 340 Hz and 340 Hz to 4 kHz to the phase compensator 146, while outputting the signal of the band of 340 Hz to 4 kHz without correction by the phase compensator 146. There is, however, provided a delay adjustor, not shown, for adjusting the delay in the signal of the bands of 0 Hz to 340 Hz and 340 kHz to 4 kHz.

The signal 128, thus amplified and band-limited, is phase-compensated if phase delay or the like has been caused by frequency-shifting of the higher sub-band signal by the phase compensator 146. It is noted that the conditions for the phase delay caused by the simulation in e.g. the designing stage have been given. The phase compensator 146 is preferably in operation in this manner responsive to the condition coincidence. The lower sub-band signal 150, obtained on combining the signal compensated for phase and the signal with the band of 340 Hz to 4 kHz, is converted by the D/A converter 134 into the corresponding analog signal.

As for the higher sub-band signals, the input signal 18 of the frequency range of 0 Hz to 8 kHz, sampled at the frequency of 16 kHz, has its lower sub-band signals limited by the QRF 98. The quadrature mirror filter 98 samples the signal, in the frequency range of 4 kHz to 8 kHz, with the frequency of 8 kHz, to send out a sampled signal 102 to the high-range corrector 106. In this high-range correcting unit 106, the digital value of the output signal 102 is amplified on the basis of the input value.

This amplified signal 110 is converted by the D/A converter 86 into the analog signal 144, which is frequency-shifted by the frequency shifter 148. A high-range output signal 152, reset to the original band, is summed to the low-range output signal 140 and sent out as the output signal 26 of the voice band correcting apparatus 10.

By this operation, even though the input signal is amplified to the maximum value in the form of digital signal, in each frequency range, the summation is made subsequently in the are of analog signal where there is no upper limit to the summation, so that it is possible to enlarge the voice band, as the spontaneous sound quality free of limitation of digital summation is maintained, even if the amplitude becomes very large as a result of the additive combination.

With the above-described configuration of the voice band correcting apparatus 10, the signal level for the band in question is amplified by the correction filter 12, the level of the output signal from the correction filter 12, supplied to the level detector 16 is compared by the level detector 16 to the respective, predetermined level, the detection signal resultant from the detection is supplied to the coefficient controller 14, the signal level is adjusted in a controlled manner by the coefficient controller 14, and the control signal 24 is supplied to the correction filter 12. The input signal 18 is thus corrected to the broadband signal, without performing excess amplification of the input signal 18 causing the quality of communication signal to be deteriorated, thus assuring high-quality transmission.

By providing the amplifier 28 and the amplitude controller 30, as a level adjustor to adjust the level of the input signal 18 to be supplied to the correction filter 12, the broadband signal as corrected may be supplied as a high-quality signal. Moreover, by providing the low-range filter 36, the intermediate filter 38 of delay only and the high-range filter 40, as the correction filter 12, by providing the amplitude measuring circuits 48 and 50 in the level detector 16, the coefficient update circuits 56 and 58 and the multipliers 60 and 62 associated with the filters of band signal excluding the band-limited input signal 18, i.e. the low-range filter 36 and the high-range filter 40, and further by providing the adder 34, the voice band may be expanded without affecting the other band, and hence with a spontaneous sound quality, even though the noise is localized in a specific band. Also with a configuration having the amplitude measurement unit 48 provided downstream, the provision of the single amplitude measurement unit 48 downstream the adder 34 suffices to contribute to reduction in number of the component parts.

The provision of the band splitter 80 on the input side of the coefficient controller 14 allows the three quadrature mirror filters 82, 84 and 86, splitting the input signal into respective frequency bands, to be separate from the correction filter 12 correcting the filter outputs 88, 92 and 90. That makes it sufficient to take account only of the positive gain of the respective filters in the correction filter 12, thereby facilitating the designing. The number of quantization steps may be made finer to enable spontaneous signal correction, which does not detract from the sound reality felt. Among the set of the quadrature mirror filters 82, 84 and 86, the filter 84 is provided with the function of delaying the signal of a band other than the limit band of the band-limited input signal 18 by a delay value equal to the delay of the correction filter 12, thus assuring flexibility in configuration of the system.

By providing the quadrature mirror filter unit 94 for sampling the output signals 108 and 110 at a sampling frequency different from that applied to the output of the correction filter 12, it is possible to output a signal conforming to the prescriptions of the ITU-T recommendations G.722.

Moreover, with the illustrative voice band correcting apparatus of the present invention, in which the input signal is split into respective bands by the band splitter 80 to send a resulting signal to the correction filter 12, the signal level is corrected for each of the bands, obtained on splitting, by the correction filter 12, and the corrected signal is converted by an D/A converter unit 132 into a analog signal, which is then combined together. The voice band may be expanded as the spontaneous sound quality is maintained, without being subjected to limitation, as imposed by the margin of digital representation, even if the signal is amplified by the correction filter 12 to close to the margin of the bit representation in the digital signal technique.

In particular, by providing the low-pass filter 82 and the high-pass filter 86 of the band splitter 80 with a delay equivalent to the delay caused as a result of filtering for a signal band other than the limit band of the band-limited input signal, and by providing the intermediate filter 84 with a delay equivalent to the processing delay caused by the filter 38, it is possible to separate the function of the correction filter 12, while it is sufficient to take account of only the positive gain in designing the correction filter 12, thereby facilitating the designing. The number of quantization steps may be made finer to enable spontaneous signal correction, which does not detract from the sound reality to be felt.

Even though the input signal is amplified in each frequency range to the maximum value in the form of digital signal, the summation is subsequently made in the form of analog signal where there is no upper limit to the summation, so that it is possible to expand the voice band, even in the case where the amplitude becomes very large as a result of the additive combination, as the spontaneous sound quality free of limitation of digital summation is maintained.

In the correction filter 12, the input band signal is amplified by the filters 36 and 40, while the delay equivalent to that of the signal of a band excluding the limit band of the input signal is applied by the filter 38, so that, even though the input signal is amplified in each frequency range to the maximum value in the form of digital signal, the summation is subsequently carried out in the form of analog signal where there is no upper limit to the summation. It is therefore possible to expand the voice band, even in the case where the amplitude becomes very large as a result of the additive combination, as the spontaneous sound quality is maintained free of limitation of digital summation.

By providing quadrature mirror filters 96 and 98 in the band splitter 80 for splitting into the low and high ranges, in keeping with the ITU-T recommendations G.722, by providing the low-range corrector 104 and the high-range corrector 106 in the correction filter 12 and by shifting the frequency of the output signal 144 of the D/A converter 138 to the original band, i.e. toward the higher sub-band, by means of the frequency shifter 148, the lower and higher sub-band signals can be combined together to supply an output signal conforming to the standard to a high-quality signal.

In this standard, the quadrature mirror filter 124 is provided downstream the low-range corrector 104 to enable processing with further band splitting. Moreover, by frequency-shifting of the output signal 128 of the quadrature mirror filter 124 to adjust the phase or the delay correspondingly in the phase compensator 146, the high-quality voice conforming to the standard may be provided without deteriorating the quality of the communication signals.

The entire disclosure of Japanese patent application No. 2003-50832 filed on Feb. 27, 2003, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

The invention claimed is:

1. A band correcting apparatus, comprising:

a corrector receiving an input signal that is limited in a frequency band for correcting the input signal with a gain to output a corrected signal, the gain being lower in a limited band and higher outside the limited band;

a monitor for monitoring whether or not a signal level of the corrected signal falls between preset maximum and minimum values to output level information; and a level adjustor for adjusting a signal level of the input signal responsive to the level information from said monitor, wherein said level adjustor includes a coefficient controller responsive to the level information for controlling a coefficient defining the gain, and wherein said corrector comprises a first filter for amplifying a band signal, excluding the input signal that is limited in a frequency band, and a second filter for applying a delay to a signal of the band excluding the limit band of the band-limited input signal, the delay being substantially equivalent to a delay of the band-limited input signal;

wherein said monitor and said level adjustor are provided correspondingly in number to the band signal of the first filter;

wherein said level adjustor includes a coefficient controller and a multiplier for multiplying the coefficient from said coefficient controller with the input signal; and wherein said apparatus further comprising an adder for summing an output of said first and second filter.

2. The apparatus in accordance with claim 1, wherein said level adjustor comprises:

a level amplifier for controlling a coefficient for amplifying the input level; and a coefficient controller for outputting the coefficient for amplifying the level of the input signal depending on the level information.

3. A band correcting apparatus comprising:

a band splitter for splitting a band of an input signal into a plurality of limit bands; and a corrector for correcting a signal level of the bands obtained by splitting for outputting correction signals wherein said band splitter comprises:

a first delay circuit for applying a delay to a signal other than the limit band of the band-limited input signal, the delay being substantially equivalent to a delay attendant on filtering of the band-limited input signal; and a second delay circuit for applying a delay substantially equivalent to a delay attendant on processing by said corrector, and wherein said apparatus further comprises:

a monitor for monitoring whether or not a signal level of a corrected signal falls between preset maximum and minimum values to output level information; and a level adjustor for adjusting a signal level of the band-limited input signal responsive to the level information from said monitor, wherein said corrector receives the band-limited input signals for correcting the band-limited input signal with a gain to output the corrected signal, the gain being lower in a limited band and higher at least outside the limited band, and wherein said level adjustor outputs a plurality of coefficients responsive to the level information for controlling the plurality of coefficients defining the gain to said corrector.

4. The apparatus in accordance with claim 3, wherein said corrector comprises: a first filter for amplifying a band signal output from said first delay circuit; and a second filter for amplifying a band signal output from said second delay circuit.

5. The apparatus in accordance with claim 3, wherein said apparatus conforms to the standard of the ITU-T (International Telecommunication Union Telecommunication standardization sector) recommendations G.722.

6. The apparatus in accordance with claim 5, wherein said band splitter comprises a quadrature mirror filter for conforming to said standard and splitting the band of the input signal into a low sub-band and a high sub-band; said corrector including:

a low-range corrector for correcting a level of the low sub-band; and a high-range corrector for correcting a level of the high sub-band;

said apparatus further comprising a shifter for shifting a frequency of an output signal of the high sub-band output by said analog converter.

7. The apparatus in accordance with claim 6, further comprising a third filter provided downstream of said low-range corrector for splitting the band.

8. The apparatus in accordance with claim 7, wherein said third filter includes a quadrature mirror filter.

9. The apparatus in accordance with claim 6, further comprising a phase adjustor for adjusting a phase or a delay of an output signal from said low-range corrector.

10. The apparatus in accordance with claim 7, further comprising a phase adjustor for adjusting a phase or a delay of an output signal from said third filter.

11. A band correction apparatus, comprising:

means for filtering an audio-frequency input signal having a low frequency component below an intermediate frequency band, an intermediate frequency component in the intermediate frequency band, and a high frequency component above the intermediate frequency band;

means for determining whether either the filtered high frequency component of the input signal or the filtered low frequency component of the input signal exceeds a predetermined signal level;

means for attenuating the high frequency component of the input signal before it is filtered if the filtered high frequency component of the input signal exceeds the predetermined signal level, and for attenuating the low frequency component of the input signal before it is filtered if the filtered high frequency component of the input signal exceeds the predetermined signal level; and means for combining the filtered low frequency, intermediate frequency, and high frequency components of the input signal so as to provide a corrected output signal.

12. The apparatus of claim 11, wherein the intermediate frequency bank ranges from about 300 Hz to about 3.4 kHz.

13. The apparatus of claim 11, wherein the means for filtering comprises first means for filtering the low frequency component of the input signal, second means for filtering the intermediate frequency component of the input signal, and third means for filtering the high frequency component of the input signal.

14. The apparatus of claim 11, wherein the means for combining comprises an adder.

* * * * *